United States Patent [19]

Tanno et al.

[11] Patent Number: 5,656,115
[45] Date of Patent: Aug. 12, 1997

[54] METHOD OF MANUFACTURING FLAT WIRING BODY

[75] Inventors: Shogo Tanno; Toshiyuki Takagi, both of Hyogo-ken, Japan

[73] Assignee: Mitsubishi Cable Industries, Ltd., Japan

[21] Appl. No.: 536,995

[22] Filed: Sep. 29, 1995

[30] Foreign Application Priority Data

Sep. 30, 1994 [JP] Japan .................................. 6-237409

[51] Int. Cl.$^6$ ..................................... B32B 31/00
[52] U.S. Cl. ..................... 156/270; 156/268; 156/275.3; 264/152
[58] Field of Search ..................... 156/257, 229, 156/250, 196, 268, 261, 270, 275.3, 311; 264/152, 500, 552

[56] References Cited

FOREIGN PATENT DOCUMENTS

| 2201820 | 8/1990 | Japan . |
| 6068722 | 3/1994 | Japan . |
| 76640 | 1/1995 | Japan . |
| 7006640 | 1/1995 | Japan . |

*Primary Examiner*—Merrick Dixon
*Attorney, Agent, or Firm*—Sixbey, Friedman, Leedom & Ferguson, P.C.; Gerald J. Ferguson, Jr.; Tim L. Brackett, Jr.

[57] ABSTRACT

A conductor foil laminated on a carrier tape via a sticking layer is stamped out so as to form cut lines on boundaries among a wiring pattern part, a first conductor remainder part forming an outer region enclosing the wiring pattern part, and a second conductor remainder part other than the wiring pattern part and the first conductor remainder part. Next, out of the conductor foil, only the first conductor remainder part is peeled from the carrier tape, and then a first insulating tape with an adhesive layer which is in a solid state at an ordinary temperature is laminated on the carrier tape. Only a region of the adhesive layer with which the wiring pattern part is covered is heated with compression by a lower hot plate so that the wiring pattern part is adhered to the insulating tape. Then, the carrier tape is peeled from the insulating tape so as to be separated therefrom at a steep angle and the second conductor remainder part at a non-adhesion state is removed. Finally, the second insulating tape is laminated on the first insulating tape and the resultant thus obtained is punched into a desired figure. In the step of adhering the wiring pattern part in a transferring step, the laminated tape is disposed in a chamber and is heated with compression under a reduced pressure, thereby preventing air bubbles from entering an interface between the wiring pattern part and the first insulating tape.

9 Claims, 16 Drawing Sheets

Fig.1
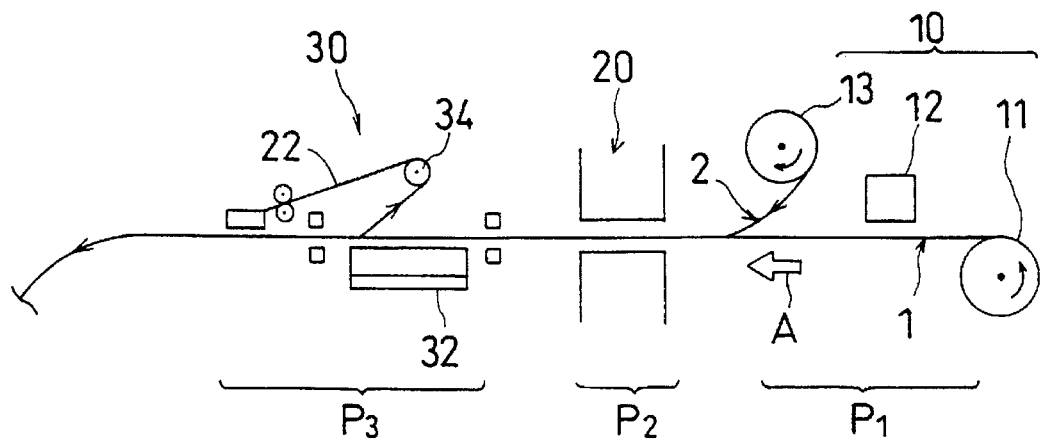
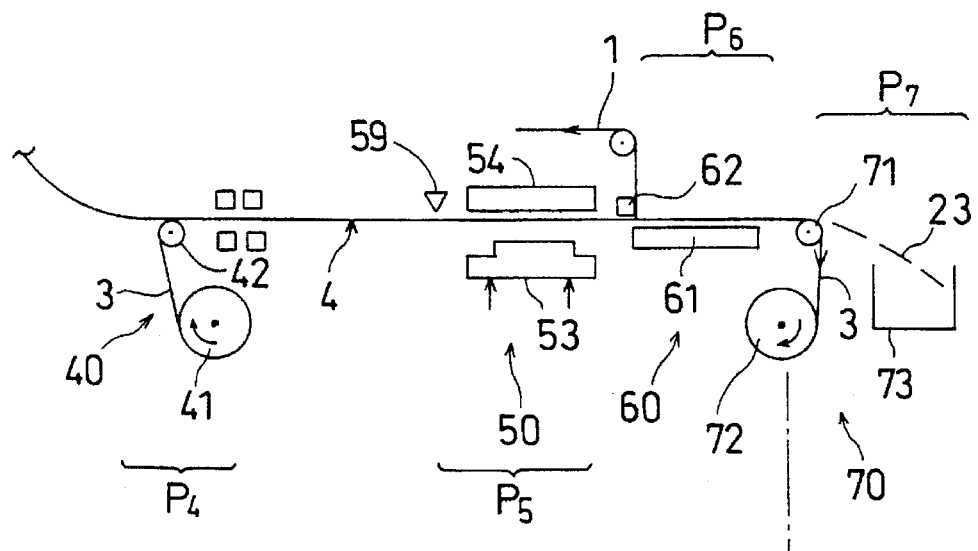
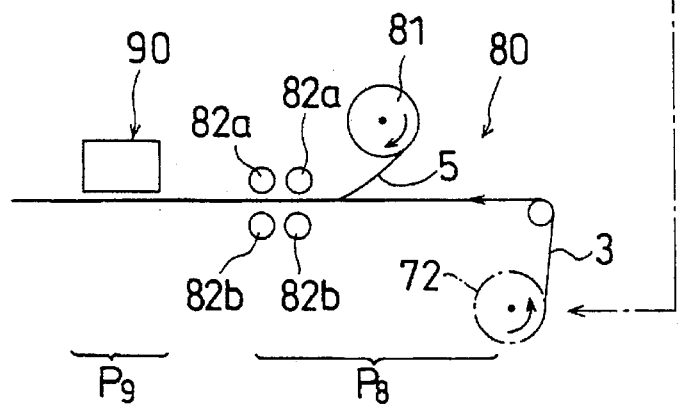

METHOD OF MANUFACTURING FLAT WIRING BODY

BACKGROUND OF THE INVENTION

This invention relates to a method of manufacturing a flat wiring body used as material for electrical wiring, in which a wiring pattern formed of a single or plurality of narrow-width conductors is sandwiched between a pair of electrical insulating films.

Such a method of manufacturing a flat wiring body has been already proposed by Applicant in the Japanese Patent Application Laid-Open Gazette No.6-68722. In this method, as shown in FIG. 17, a conductor foil b is first laminated on a carrier tape a through a sticking layer, only the conductor foil b is stamped out along a predetermined wiring pattern so as not to mutilate the carrier tape a, and then the conductor foil b is divided into a wiring pattern part c and a conductor remainder part d which is a non-wiring part except for the wiring pattern part c. Next, out of the conductor foil b on the carrier tape a, only the conductor remainder part d is peeled and removed so that only the wiring pattern c is left on the carrier tape a. Then, a first insulating tape (not shown) having an adhesive layer is laminated on the carrier tape a so that the wiring pattern part c is transferred to the first insulating tape based on the superiority of the bonding strength of the adhesive layer of the first insulating tape over the bonding strength of the sticking layer on the carrier tape a. Thereafter, the carrier tape a is rolled up. Then, a second insulating tape (not shown) having an adhesive layer as in the first insulating tape is laminated on the first insulating tape to which the wiring pattern part c is transferred, thereby forming a laminate containing the wiring pattern part. The laminate is stamped out into a desired profile thereby obtaining a flat wiring body.

In the above method, if the carrier tape is not securely held in a flat state in the step of peeling the conductor remainder part, the wiring pattern part may be also peeled together with the conductor remainder part. To deal with this problem, Applicant has proposed another method in the Japanese Patent Application Laid-Open Gazette No.7-6640. In this method, the outer surface of the carrier tape is vacuum-suctioned so that the carrier tape is securely held in a flat state, and at this state the conductor remainder part is peeled.

However, in this proposed method, since the conductor remainder part d has a substantially larger area as compared with the wiring pattern part a (see FIG. 17), a relatively large resistance generates from the sticking layer of the carrier tape when the conductor remainder part is peeled. Therefore, the conductor remainder part must be peeled off with a relatively large tension over the resistance against the peeling. This may tear the conductor remainder part from the intermediate portion and such a large tension may lift even the carrier tape vacuum-suctioned. In addition, since the above resistance against the peeling and the tension act on the peeling position of the conductor remainder part, the conductor remainder part is curved at the peeling position at an acute angle to cause plastic deformation. This may invite a breakage of the conductor remainder part at the peeling position. Such a breakage stops the production line. Further, since warpage and distortion occur at the conductor remainder part due to the plastic deformation, when the conductor remainder parts are recovered and collected, the collected remainder parts are extremely bulky. Accordingly, the collected remainder parts must be compressed to compact them. This requires an extra step for compressing them.

As the sticking layer is heated up, its sticking strength becomes smaller. Accordingly, it may be considered that at the peeling of the conductor remainder part the carrier tape is heated up to reduce the resistance against the peeling. However, if the heating temperature is set very high, the wiring pattern part becomes susceptible to peeling over the limit at the same time. This invites the delamination of the wiring pattern part even by a slight contact, together with the peeling of the conductor remainder part.

Further, in the step of transferring the wiring pattern part c to the first insulating tape, it is necessary that both of them are made secure and close contact with each other to prevent air bubbles from being trapped therebetween.

In view of the foregoing problems, the present invention has been made. An object of the present invention is to securely separate the conductor remainder part from the wiring pattern part thereby facilitating the removal of the conductor remainder part and also securely adhere only the wiring pattern part to the insulating tape in the transferring step.

SUMMARY OF THE INVENTION

To attain the above object, a method of manufacturing a flat wiring body comprises a step of laminating a conductor foil, a stamping step, a first conductor remainder part removing step, a step of laminating an insulating tape and a transferring step. In the transferring step, a wiring pattern part is adhered to an insulating tape, and a carrier tape or the like is peeled and removed. In the step of laminating a conductor foil, a conductor foil is laminated on one surface of the carrier tape via a sticking layer. In the stamping step, only the laminated conductor foil is stamped out without cutting the carrier tape in a manner of forming cut lines along which the conductor foil is divided into a wiring pattern part, a first conductor remainder part forming an outer region enclosing the wiring pattern part, and a second conductor remainder part forming the rest other than the first conductor remainder part and the wiring pattern part. In the first conductor remainder part removing step, out of the conductor foil after conducted to the stamping step, only the first conductor remainder part is peeled from the carrier tape. In the step of laminating an insulating tape, an insulating tape having an adhesive layer is laminated on the carrier tape from which the first conductor remainder part is removed in a manner of contacting the adhesive layer with the conductor foil, thereby forming a laminate. Then, in the step of adhering the wiring pattern part to the insulating tape of the transferring step, at least the corresponding region of the laminate to the wiring pattern part is heated with compression so that only the wiring pattern part is adhered to the insulating tape.

According to the invention having the above structure, in the stamping step, stamping is conducted to the conductor foil laminated on the carrier tape via the sticking layer in the conductor foil laminating step, so as to form cut lines alone which the conductor foil is divided into the wiring pattern part, the first conductor remainder part and the second conductor remainder part. At this time, the cut lines are formed only with respect to the conductor foil and the carrier tape is not cut so that the carrier tape can serve as a carrier of the conductor foil which is divided into the wiring pattern part and others. Next, in the first conductor remainder part removing step, the first conductor remainder part is peeled and removed so that only the wiring pattern part is left within the region having been formed of the wiring pattern part and the first conductor remainder part, the region surrounding the entire wiring pattern part. At this time, the entire conductor remainder part exclusive of the wiring pattern part is not peeled. That is, the entire conductor remainder part is divided into the first and second parts, and only the first conductor remainder part having a relatively small area around the wiring pattern part is peeled. Accordingly, the resistance from the sticking layer of the carrier tape becomes extremely small as compared with the case that the entire conductor remainder part is peeled, so that the peeling can be readily made with a relatively small tension corresponding to the resistance.

Then, in the step of laminating an insulating tape, the insulating tape is laminated, through the adhesive layer, on the wiring pattern part and the second conductor remainder part on the carrier tape, so that the wiring pattern part and the second conductor remainder part are sandwiched between the sticking layer of the carrier tape and the adhesive layer of the insulating tape. With respect to the laminate of the above state, in the step of adhering the wiring pattern part of the transferring step, the adhesive layer is heated with compression at a region corresponding to the wiring pattern part, so that only the wiring pattern part is firmly adhered to the insulating tape. On the other hand, the adhesive layer in contact with the second conductor remainder part is held in a solid state of ordinary temperature, so that the second conductor remainder part is held in simple contact with the insulating tape. In other words, since the conductor foil exclusive of the wiring pattern part is removed from the conductor foil region having been formed of the wiring pattern part and the first conductor remainder part in the first conductor remainder part removing step, even if the corresponding region of the adhesive layer to the wiring pattern part is heated with compression, it is prevented that the conductor foil other than the wiring pattern part is adhered to the insulating tape.

As mentioned above, according to the present invention, since the conductor foil is divided into the wiring pattern part, the first conductor remainder part which is a relatively small outer region enclosing the wiring pattern part and the second conductor remainder part which is a relatively large region in the stamping step and the first conductor remainder part is removed before the step of transferring the wiring pattern part to the insulating tape, the unnecessary conductor foil part out of the region enclosing the entire wiring pattern part can be securely removed at the time of the step of adhering the wiring pattern in the transferring step. Accordingly, even if the adhesive layer is heated with compression at the region corresponding to the entire wiring pattern part in the step of adhering the wiring pattern part, the second conductor remainder part cannot be adhered to the insulating tape and only the wiring pattern part can be securely adhered to the insulating tape. Further, the second conductor remainder part can be securely held in a non-adhesion state in the step of adhering the wiring pattern part. Accordingly, in the subsequent step of removing the second conductor remainder part, the removal operation can be made readily and securely and the wiring pattern part can be securely prevented from generating a pattern disturbance such as a displacement.

In addition, since the conductor remainder part is stamped out so as to be separated into the first and second conductor remainder parts in the stamping step, the area of the first conductor remainder part which is peeled and removed in the first conductor remainder part removing step, can be substantially reduced as compared with the conventional method of peeling the entire conductor remainder part at a time. Thereby, the resistance which the first conductor remainder part receives from the sticking layer of the carrier tape at the peeling, can be substantially reduced, so that the first conductor remainder part can be readily peeled with a substantially small tension as compared with the conventional case. Further, even in the case of heating the sticking layer in correspondence with the peeling area, the heating temperature can be decreased thereby eliminating the possibility of troubles such as a delamination of the wiring pattern part.

In the first-mentioned invention, it is preferable that the first conductor remainder part to be stamped out in the stamping step has a shape that is slightly peripherally extended from the wiring pattern part. In this case, since the first conductor remainder part to be stamped out in the stamping step includes a region slightly peripherally extended from the entire wiring pattern part and is formed substantially along the outline of the entire wiring pattern part, an area of the first conductor remainder part to be peeled in the first conductor remainder part removing step is minimized so that a resistance against the peeling is minimized. Accordingly, in this case, while the requirement in the step of adhering the wiring pattern part, that is, the requirement of previously eliminating the unnecessary conductor remainder part within the region formed substantially along the outline of the entire wiring pattern part is satisfied, the resistance against the peeling of the first conductor remainder part can be minimized in the first conductor remainder part removing step. Thereby, the removal of the first conductor remainder part can be readily and securely achieved.

Further, in the first-mentioned invention, it is preferable that the step of adhering the wiring pattern part in the transferring step is conducted in a manner of pressing a hot plate having a shape corresponding to the entire wiring pattern part against a position of an outer surface of the insulating tape or a position of an outer surface of the carrier tape each corresponding to the position of the wiring pattern part to adhere the wiring pattern part to the insulating tape. In this case, the object to be adhered by heating with compression in the step of adhering the wiring pattern part is securely limited to only the wiring pattern part, out of the wiring pattern part and the second conductor remainder part which are interposed between the carrier tape and the insulating tape, so that the second conductor remainder part can be readily and securely made in a non-adhesion state.

Furthermore, in the first-mentioned invention, it is preferable that the step of adhering the wiring pattern part of the transferring step is conducted in a manner that after the entire laminate including the wiring pattern part is positioned in a chamber, the chamber is reduced in pressure and the laminate is heated with compression under the reduced pressure. In this case, since the laminate is disposed in the chamber under a set reduced pressure and then heated with compression, it can be securely prevented that air bubbles enter between the wiring pattern part to be adhered and the adhesive layer of the insulating tape, so that the wiring pattern part can be brought into close contact with the insulating tape over the wiring pattern part surface.

In the transferring step of the first-mentioned invention, it is preferable that after the wiring pattern part adhering step in which only the wiring pattern part is adhered to the insulating tape, the step of peeling the carrier tape in a manner of separating it from the laminate at a steep angle while pressing the delaminating bar against the outer surface on the carrier tape side of the laminate is carried out. In this case, the carrier tape is separated away from the laminate at a steep angle by the delaminating bar so that the carrier tape can be readily and securely peeled from the insulating tape. Further, if prior to the separation of the carrier tape the outer surface on the carrier tape side of the laminate is pressed against a roller heater or the like so that the resistance of the sticking layer of the carrier tape against the peeling is reduced due to heating of the roller heater, the peeling of the carrier tape and the removal of the second conductor remainder part can be carried out further readily.

In the above step of peeling the carrier tape, it is preferable that the carrier tape peeling step and the second conductor remainder part removing step of removing the second conductor remainder part may be carried out sequentially. In this case, after the wiring pattern part is adhered to the insulating tape, the carrier tape in the laminate is peeled from the insulating tape in the carrier tape peeling step, and then the second conductor remainder part accompanying the insulating tape at the non-adhesion state is removed from the insulating tape in the second conductor remainder part removing step. Thereby, the insulating tape to which only the wiring pattern part is adhered can be obtained so that the transfer of the wiring pattern part can be completed. In addition, all the conductor foil is removed from the carrier tape thereby permitting the carrier tape to be reused.

Further, it is preferable that the step of peeling the carrier tape is composed of a separating step in which the peeling of the carrier tape and the removal of the second conductor remainder part are simultaneously carried out. In this case, by separating the carrier tape from the laminate at a steep angle in the separating step, the carrier tape is peeled from the insulating tape, and at the same time the second conductor remainder part which is not adherent to the insulating tape and difficult to bend can be readily peeled and removed. For example, if the carrier tape is separated from the laminate downward at a steep angle, the peeled second conductor remainder part spontaneously falls downward so that it is automatically removed. On the other hand, in the case that the carrier tape is separated from the laminate upward at a steep angle, the peeled second conductor remainder part can be removed so as to be pull out. Thus, through both the wiring pattern part adhering step and the separating step, the insulating tape to which only the wiring pattern part is adhered is obtained thereby completing the step of transferring the wiring pattern part, while all the conductor foil removed from the carrier tape thereby permitting the carrier tape to be reused.

In the above separating step, preferably, while the carrier tape or the laminate is transported forward in unit dimensions, the carrier tape or the laminate is conducted to the stamping step, the first conductor remainder part removing step and the wiring pattern part adhering step when it is put on hold. The separating step is preferably performed through the continuous transporting mechanism, after the wiring pattern part adhering step, while the laminate is continuously transported forward in a transporting direction. In this case, the carrier tape and the laminate are transported intermittently so that the stamping step, the first conductor remainder part removing step and the wiring pattern part adhering step can be performed with the carrier tape or the laminate put on hold, thereby securely performing the respective steps. Further, in the separating step, since the laminate is transported continuously through the continuous transporting mechanism, the peeling of the carrier tape, the removal of the second conductor remainder part and the recovery of the insulating tape to which the wiring pattern part is adhered can be continuously carried out, thereby accomplishing a enhanced efficiency of the separating step and simplification of the device.

Furthermore, in the transferring step of the first-mentioned invention, it is preferable that after the wiring pattern part adhering step, the carrier tape is peeled from the laminate with the second conductor remainder part stuck thereto and then the second conductor remainder part is removed from the carrier tape in a manner of curving the carrier tape at a steep angle while pressing a delaminating bar against an outer surface of the carrier tape. In this case, since the removal of the second conductor remainder part is performed in a step different from the carrier tape peeling step, even if any trouble generates in the second conductor remainder part removing step, the trouble-can be treated with no effects on the step prior to the second conductor remainder part removing step. In addition, since the second conductor remainder part is stuck to the carrier tape after peeling, the second conductor remainder part removing step can be carried out after the sticking strength of the carrier tape is reduced by heating the carrier tape or in other manners. Accordingly, the step of removing the second conductor remainder part can be securely carried out.

BRIEF EXPLANATION OF THE DRAWINGS

FIG. 1 is a schematic diagram showing a manufacturing device for realization of a first embodiment.

DETAILED DESCRIPTION OF THE PREFERRED EMBODIMENTS

Figure 2:
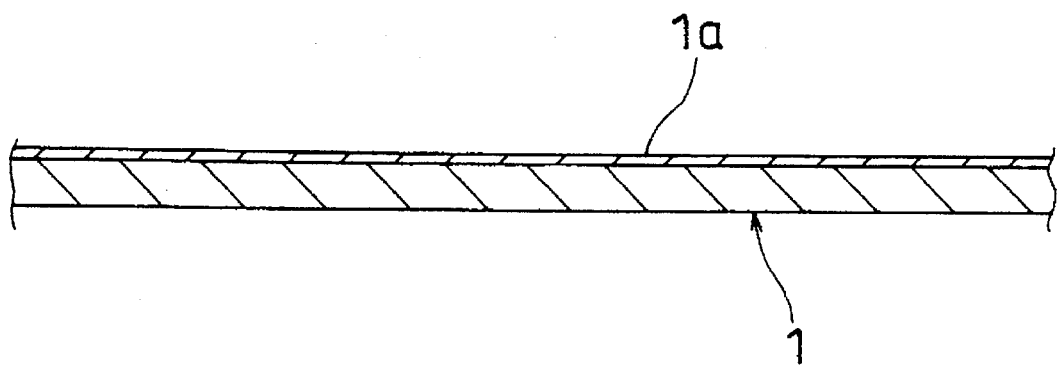
FIG. 2 is an enlarged cross-section of a carrier tape on which a sticking layer is laminated.

Description is made below about embodiments of the present invention with reference to the drawings.

<First Embodiment>

FIG. 1 shows a manufacturing device for realization of a method of manufacturing a flat wiring body according to a first embodiment of the present invention. Reference numeral 10 indicates a conductor foil laminating means for performing a conductor foil laminating step P1, 20 indicates a half-cut press machine for performing a stamping step P2, 30 indicates a first conductor remainder part removing means for performing a first conductor remainder part removing step P3, 40 indicates a first insulating tape laminating means for performing a first insulating tape laminating step P4, 50 indicates a wiring pattern part adhering means for performing a wiring pattern part adhering step P5, 60 indicates a carrier tape peeling means for performing a carrier tape peeling step P6, 70 indicates a second conductor remainder part removing means for performing a the second conductor remainder part removing step P7, 80 indicates a second insulating tape laminating means for performing a second insulating tape laminating step P8, and 90 indicates an outline stamping machine for performing an outline stamping step P9. The step P5, the step P6 and the step P7 form a transferring step according to claims 1, 5 and 8 of the present invention. Below, in each of the steps P1 to P9, description is made about the structures of means 10 to 90 to be used in the steps and the contents of the steps P1 to P9 to be performed with the use of the above means.

(Conductor Foil Laminating Step P1)

Figure 3:
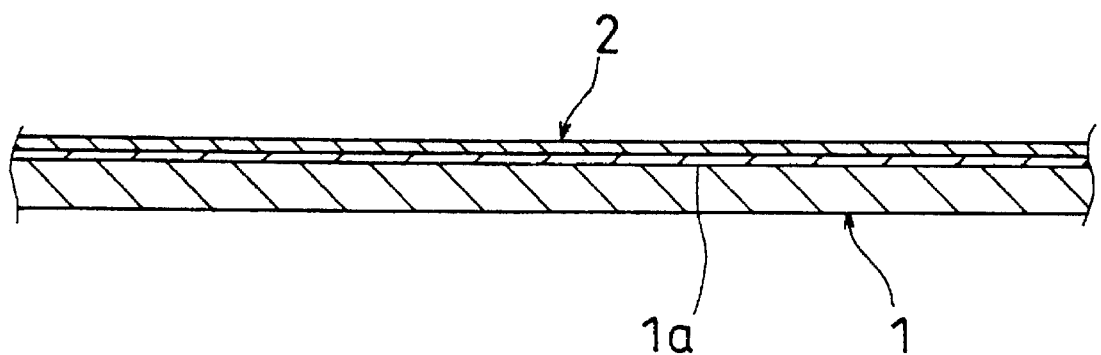
FIG. 3 is an enlarged cross-section of the carrier tape on which a conductor foil is laminated.

The conductor foil laminating means 10 has a drum around which a long carrier tape 1 is wound, a sticking layer forming machine 12, and a drum 13 around which a long conductor foil 2 made by metallic material such as copper having good conductivity is wound with a set width. In the conductor foil laminating step P1, the carrier tape i is first fed intermittently at set intervals in a direction of arrow A from the drum 11. The carrier tape 1 thus fed is coated with sticking agent by the sticking layer forming machine 12 so that a sticking layer 1a is formed on the upper surface of the carrier tape 1 as shown in detail in FIG. 2. Next, the conductor foil 2 is fed to the sticking layer 1a of the carrier tape 1 from the drum 13 and is then laminated on the sticking layer 1a as shown in FIG. 3 so as to be stuck to the sticking layer 1a.

(Stamping Step P2)

The half-cut press machine 20 has a stamping die edge (not shown) such as Victoria die edge with a set shape. In the stamping step P2, every time the carrier tape 1 on which the conductor foil 2 is laminated is transported intermittently, the stamping die edge is moved downward by a set distance and only a part of the conductor foil 2 which is laminated on the carrier tape 1 is stamped out, so that cut lines corresponding to the stamping die edge are formed on the conductor foil 2 without cutting the carrier tape 1. As shown in detail in FIG. 4, the cut lines formed in the stamping step P2 divide the conductor foil 2 into a wiring pattern part 21, a first conductor remainder part 22, two second conductor remainder parts 23a, 23b (or integrally referred to as 23), and a positioning mark part 24.

The wiring pattern part 21 is composed as a unit of a set of plural separate conductors 25, 25, . . . (three conductors in the figure). The first conductor remainder part 22 is so composed that an inter-conductor remainder part between the adjacent conductors 25, 25 in each unit of the wiring pattern part 21, a peripheral remainder part surrounding the entire unit of the wiring pattern part 21 with the same width as the inter-conductor remainder part and a remainder part surrounding the positioning mark part 24, are continuously formed. In short, the first conductor remainder part 22 has a shape substantially corresponding to the outline enclosing the entire wiring pattern part 21 and the positioning mark part 24. In addition, the first conductor remainder part 22 is formed into series with another first conductor remainder part 22 surrounding another unit of wiring pattern part 21 via a connection part 22a. Further, extending parts 22b, 22c are integrally formed in each first conductor remainder part 22. The extending parts 22b, 22c on both sides in a width direction divide the second conductor remainder part 28 into two parts 23a, 23b.

(First Conductor Remainder Part Removing Step P3)

Figure 5:
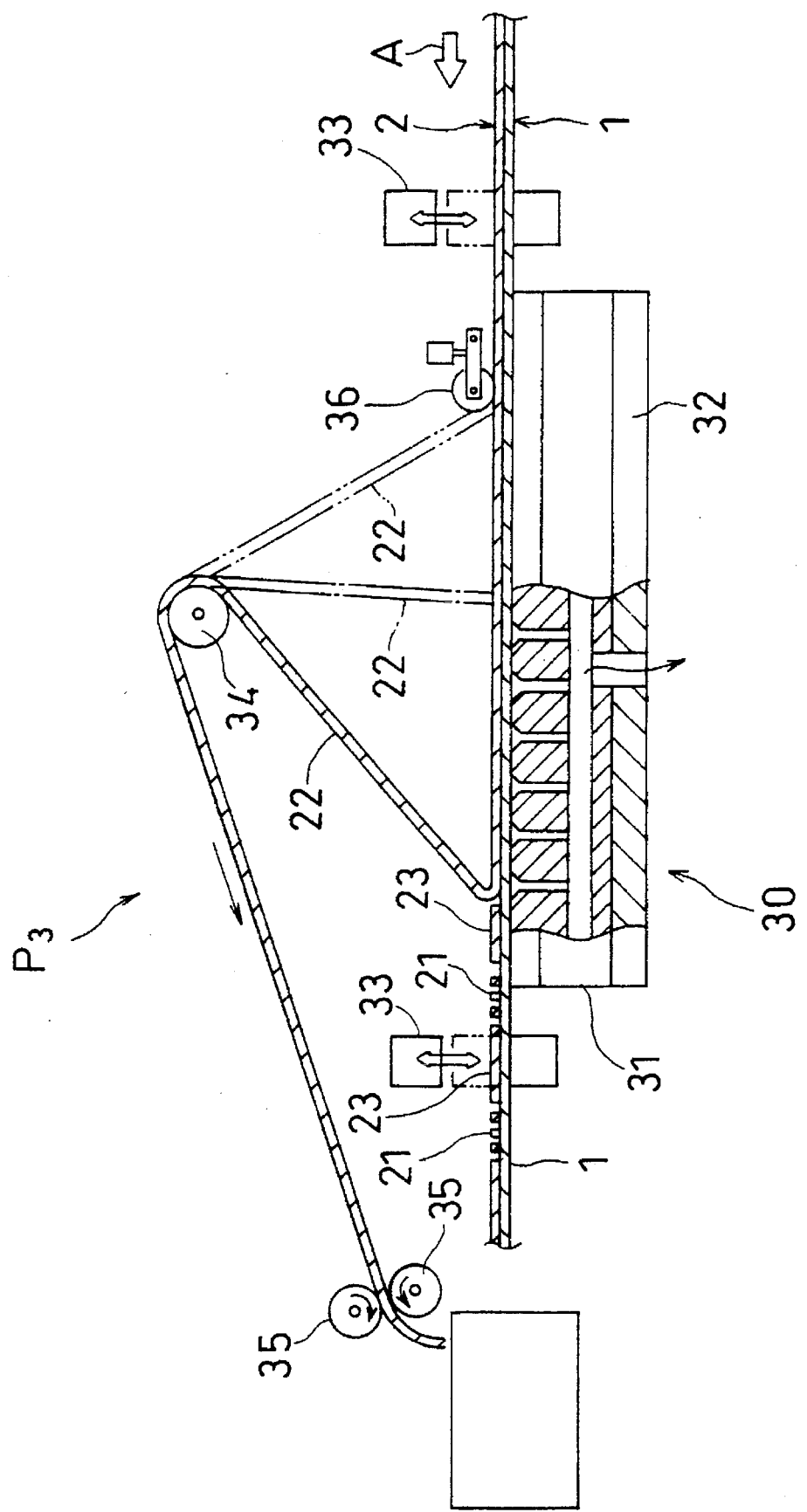
FIG. 5 is a schematic elevation partly cut away of a device used in a first conductor remainder part removing step.
Figure 8:
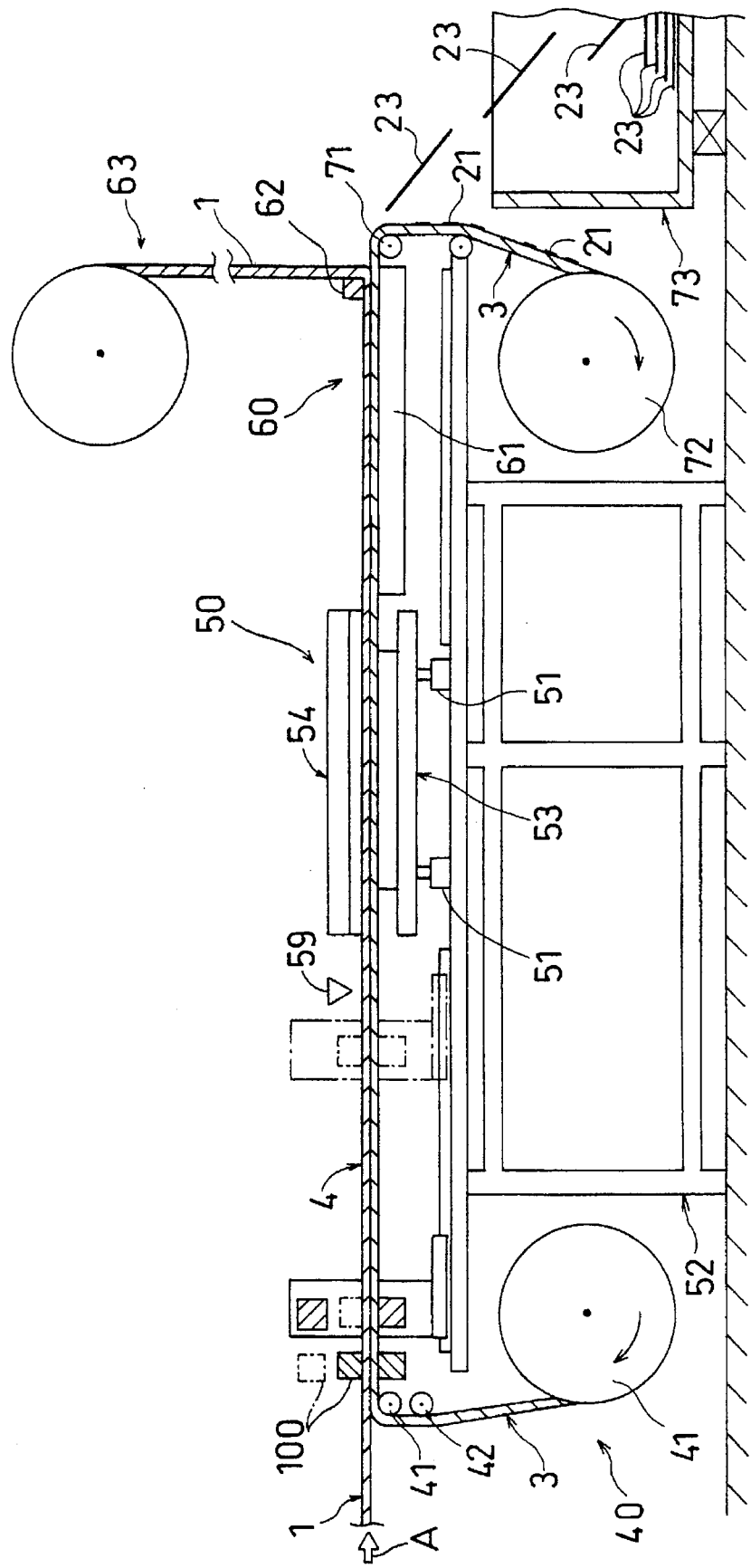
FIG. 8 is a schematic elevation of a device in which respective steps for peeling of a first insulating tape, adhesion of a wiring pattern part, peeling of a carrier tape and removal of a second conductor remainder part are performed.
Figure 9:
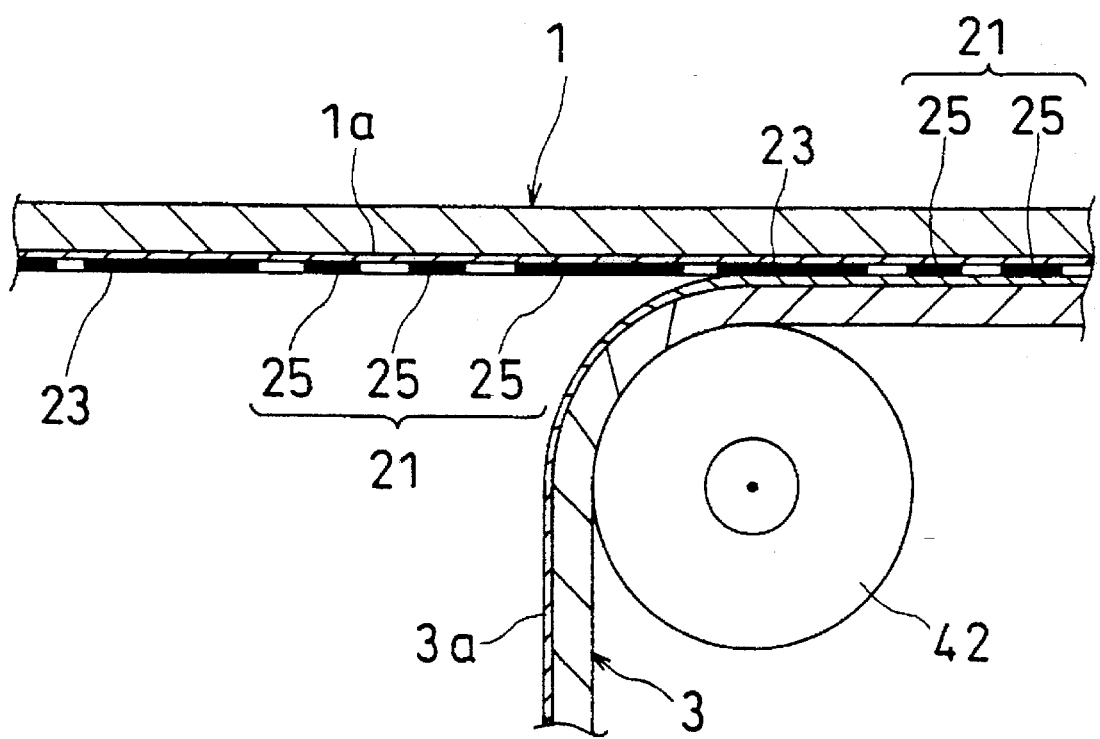
FIG. 9 is an enlarged cross-section showing a state of a step of laminating the first insulating tape.
Figure 11:
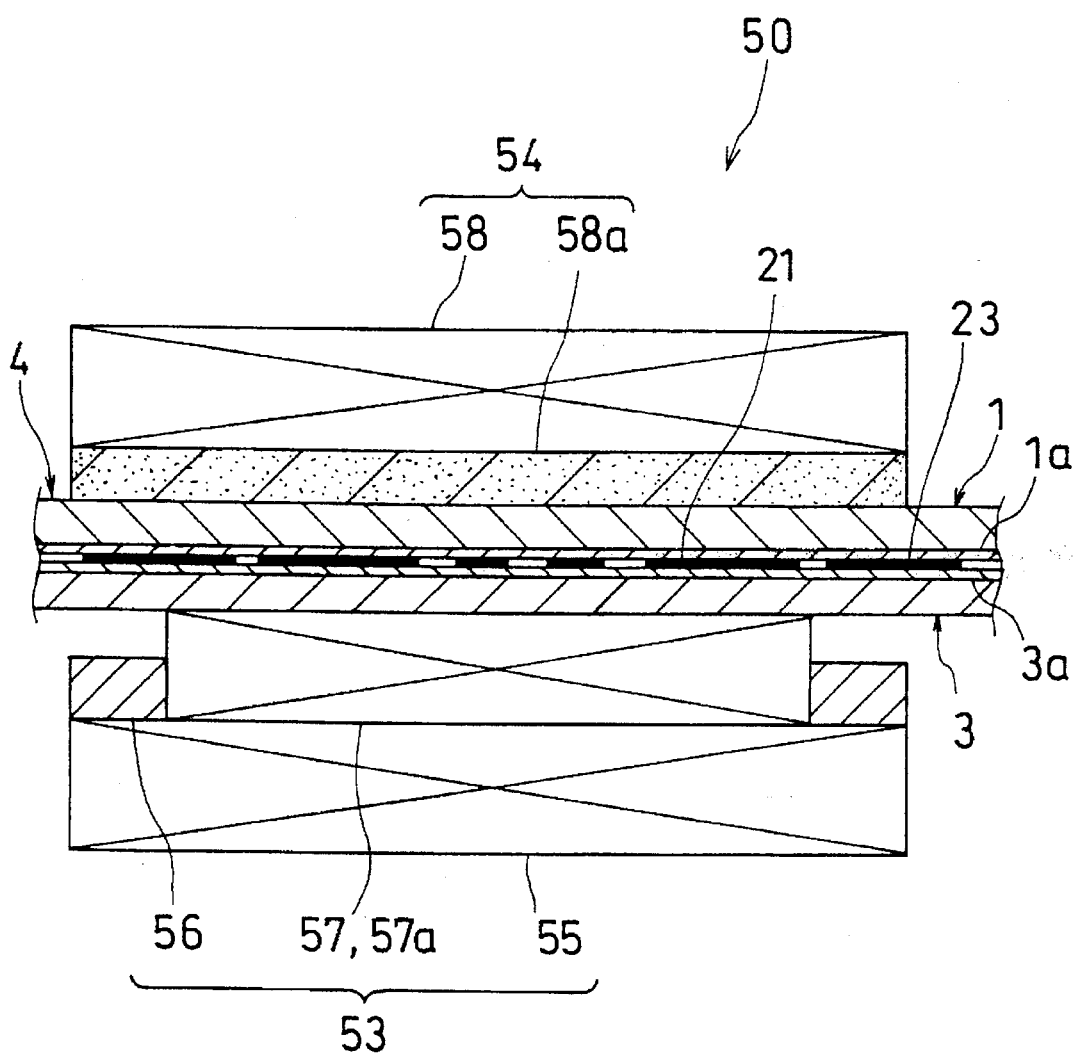
FIG. 11 is a schematic enlarged cross-section of the lower hot plate.

As shown in detail in FIG. 5, the first conductor remainder part removing means 30 has a vacuum suction plate 31 for suctioning the carrier tape 1 to hold it in a flat state, a heater 32 for heating the carrier tape 1 through the vacuum suction plate 31, a pair of clamp mechanisms 33, 33 which are disposed at respective positions of the upstream and downstream sides in a transporting direction A with respect to the vacuum suction plate 31 and are for positioning the carrier tape 1 transported intermittently, a bar-shaped pulley 34 disposed at a specified position above from the vacuum suction plate 31, and a pair of driving pulleys 35, 35 for sandwiching the peeled first conductor remainder part 22 from top and reverse surface sides thereof and applying a set tension to it in a peeling direction. FIG. 5 is substantially exaggerated for purpose of illustration in relation to thicknesses of the carrier tape 1 and the conductor foil 2. FIGS. 8, 9 and 11 are the same.

The vacuum suction plate 31 is made by material having a good thermal conductivity and is formed into a flat plate having the substantially same width as the carrier tape 1 and a set length. The top surface of the vacuum suction plate 3 is provided with recessed grooves (not shown) formed in a grid and a large number of suction holes 31a, 31a, . . . opening to each of the recessed grooves. The vacuum suction plate 31 is so composed as to suction the reverse surface of the carrier tape 1 on the vacuum suction plate 81 by the action of a blower (not shown) to position the carrier tape 1 in a flat state. The suction force of the blower is set larger than a sticking strength of the sticking layer 1a with respect to the first conductor remainder part 22.

Figure 6:
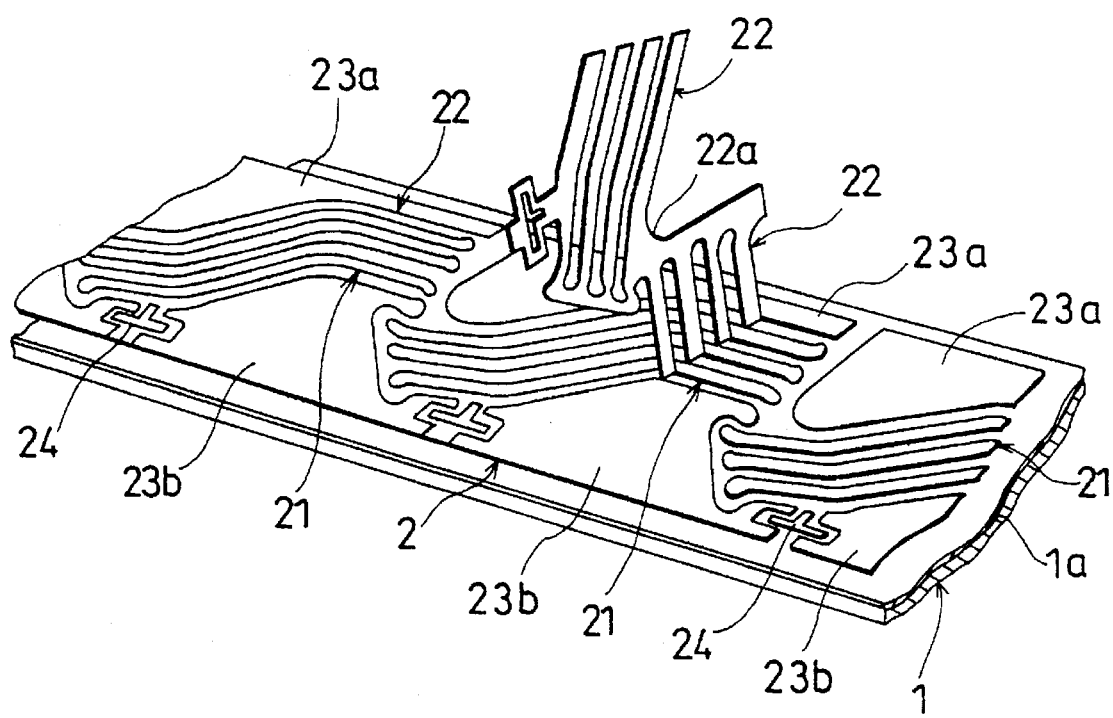
FIG. 6 is a perspective view showing a state that the first conductor remainder part is peeled.
Figure 7:
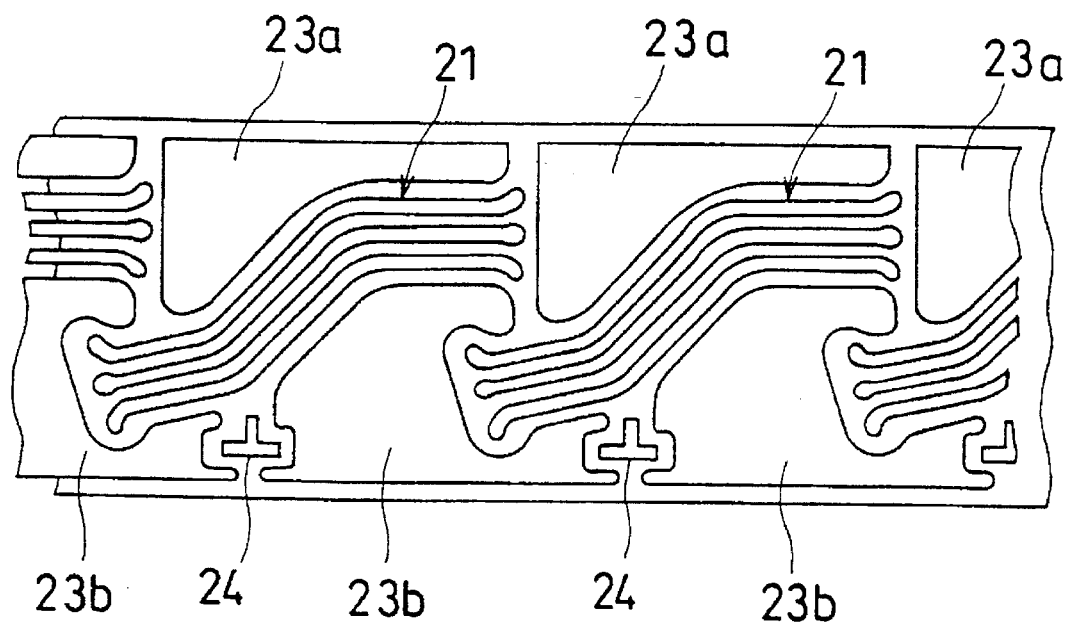
FIG. 7 is a view, corresponding to FIG. 4, showing a state that the first conductor remainder part is removed.

In the first conductor remainder part removing step the conductor-foil laminated carrier tape 1 which has been transported intermittently in a transporting direction A is positioned by means of both the clamp mechanisms 33, 33. Next, the carrier tape 1 is held in a flat state by the action of the vacuum suction plate 31 and at this state the sticking layer 1a (see FIG. 3) is heated by the heater 32 to reduce its sticking strength. At this state, as shown in FIG. 6, a pair of driving pulleys 35 are driven to delaminate a series of first conductor remainder parts 22, 22, . . . from the carrier tape 1. According to the peeling, the peeled first conductor remainder part 22 moves in the manner shown in a dot-dash line and a two dots-dash line of FIG. 5 to activate a detecting sensor 36, thereby completing the present step P3. As shown in FIG. 7, the carrier tape 1 is transported to the next step P4 while the wiring pattern parts 21, 21, . . . the second conductor remainder parts 23a, 23b, . . . and the positioning marks 24, 24, . . . are separated away from one another by the width corresponding to the first conductor remainder parts 22, 22, . . . thus peeled. On the way from the present step P3 to the next step P4, the carrier tape 1 to which the wiring pattern parts 21, 21, . . . are stuck is reversed by means of a non-shown guide roller or the like. That is, the carrier tape 1 is transported to the next step P4 in a manner that the sticking layer is faced downward.

(First Insulating Tape Laminating Step P4)

As shown in detail in FIG. 8, the first insulating tape laminating means 40 is composed of a drum 41 around which a long first insulating tape 3 made of polyethylene terephtalate film or the like is wound, and guide rollers 42, 42. As shown in FIG. 9, a hot-melt layer 3a as an adhesive layer which is in a solid state at an ordinary temperature is laminated on one surface of the first insulating tape 3. In the first insulating tape laminating step P4, the first insulating tape 3 is fed from the drum 41, and the first insulating tape 3 and the carrier tape 1 transported from the preceding step P3 are laminated. At this time, the wiring pattern parts 21, 21, ... and the second conductor remainder parts 23a, 23b, ... are laminated in such a manner as to be sandwiched between the hot-melt layer 3a of the first insulating tape 3 and the sticking layer 1a of the carrier tape 1, thereby forming a laminated tape 4 as a laminate.

(Wiring Pattern Part Adhering Step P5)

As shown in FIG. 8, the wiring pattern part adhering means 50 comprises a lower hot plate 53 supported movably upward and downward with respect to a support table 52 by air cylinders 51, 51, and an upper hot plate 54 vertically opposed to the lower hot plate 53 via the laminated tape 4.

Figure 10:
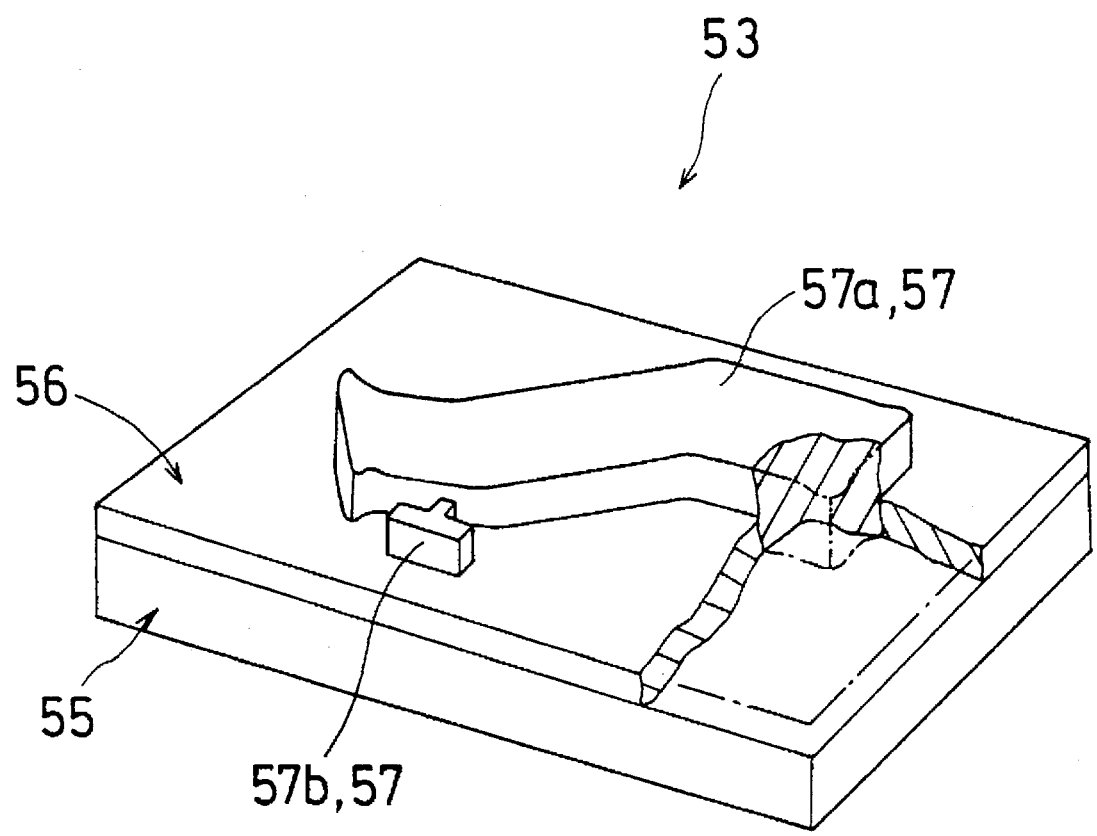
FIG. 10 is an enlarged perspective view partly cut away of a lower hot plate.

As shown in FIG. 10, the lower hot plate 53 is composed of a heater 55, a thermal insulating plate 56 for covering the upper surface of the heater 55 to block upward thermal effects by the heater 55, and a heat conducting plate 57 the lower surface of which contacts the heater 55 and the upper surface of which penetrates the thermal insulating plate 56 to protrude above it. The heat conducting plate 57 is composed of a first heat conducting plate 57a having a form substantially matched with the entire wiring pattern part 21, and a second heat conducting plate 57b having a form matched with the positioning mark part 24. The first and second heat conducting plates 57a, 57b are each made of material having a good thermal conductivity and are each formed thicker than the thermal insulating plate 56. Further, the first and second thermal conducting plates 57a, 57b are positioned in such a manner as to be engaged in the thermal insulating plate 56. As shown in FIG. 11, the upper hot plate 54 is composed of a heater 58 and a cushion plate 58a made of high-temperature-resistant material such as silicon and disposed on the bottom surface of the heater 58. When the specified positioning mark 24 of the laminated tape 4 is detected by an optical sensor 59 shown in FIG. 8, the laminated tape 4 is positioned by a clamp mechanism 100, so that the first heat conducting plate 57a is positioned below the wiring pattern part 21 of the laminated tape 4 and the second heat conducting plate 57b is positioned below the positioning mark 24.

The wiring pattern part adhering step P5 is initiated after the laminated tape 4 is transported in a transporting direction A, when the specified positioning mark 24 is sensed by the optical sensor 59 so that the laminated tape 4 is positioned by the clamp mechanism 100. Then, the lower hot plate 53 is moved upward from the lower position by the action of the air cylinders 51, 51 to sandwich the laminated tape 4 between the heat conducting plate 57 and the cushion plate 58a of the upper hot plate 54 and press it. At this state, heat application is made at a set temperature (for example, 140° to 170° C. by the lower hot plate, or as necessary, additionally, for example, 100° C. by the upper hot plate). Thereby, out of the hot-melt layer 3a of the first insulating tape 3 of the laminated tape 4, only the region covering the wiring pattern part 21 and the positioning mark 24 is heated with compression so that only the wiring pattern part 21 and the positioning mark 24 are adhered to the first insulating tape 3. At this time, the thermal insulating plate 58 blocks thermal effects on the region other than the wiring pattern part 21 and the positioning mark 24, that is, on the second conductor remainder part 23. Accordingly, the hot-melt layer 3a at the region covering the second conductor remainder part 23 can be prevented from melting so as to be held in a non-adhesion state with the first insulating tape 3.

(Carrier Tape Peeling Step P6)

The carrier tape peeling means 60 comprises a flat hot plate 61 substantially identical in width with the carrier tape 1, a delaminating bar 62 disposed above the hot plate 61 with a set vertical distance left, and a recovering mechanism 63 for continuously recovering the peeled carrier tape 1.

In the carrier tape peeling step P6, after the wiring pattern part adhering step P5, the laminated tape 4 is intermittently transported and the sticking layer 1a of the carrier tape 1 is heated by the hot plate 61 to reduce its sticking strength. Thereby, the carrier tape 1 of the laminated tape 4 is peeled from the wiring pattern part 21 and the second conductor remainder part 23 so as to be separated at a steep angle by the corner of the delaminating bar 62, so that the wiring pattern part 21 is laminated on the first insulating tape 3 in contact and the second conductor remainder part 23 is laminated on the same in non-contact.

(Second Conductor Remainder Part Removing Step P7)

The second conductor remainder part removing means 70 comprises a guide roller 71 for curving the first insulating tape 3 downward at a steep angle at a downstream position from the carrier tape peeling means 60, a drum 72 for rolling up the first insulating tape 3 to which the wiring pattern part 21 is adhered, and a recovering container 73 for recovering the second conductor remainder part 23. In the second conductor remainder part removing step P7, when the laminated tape 4 is transported after the carrier tape peeling step P6, the first insulating tape 3 is curved by the guide roller 71, so that the second conductor remainder part 23 placed on the first insulating tape 3 at a non-adhesion state are recovered so as to be dropped into the recovering container 73.

(Second Insulating Tape Laminating Step P8)

The second insulating tape laminating means 80 comprises a drum 81 (see FIG. 1) around which a second insulating tape 5 having the same structure as the first insulating tape 3 is wound, and two pairs of application rollers 82a, 82b, 82a, 82b. In the second insulating tape laminating step P8, while the first insulating tape 3 rolled up by the drum 72 in the second conductor remainder part removing step P7 is fed from the drum 72, the second insulating tape 5 is fed from the drum 81. Then, both the first and second insulating tapes 3, 5 are collected in such a manner that the hot-melt layer 3a of the first insulating tape 8 to which the wiring pattern part 21 is adhered is opposed to a hot-melt layer of the second insulating tape 5, and are then passed between the respective pairs of application rollers 82a, 82b while heated. Thereby, the first and second insulating tapes 3, 5 are adhered to each other in a laminate with the wiring pattern part 21 interposed therebetween.

(Outline Stamping Step P9)

In the outline stamping step P9, the first and second insulating tapes 3, 5 laminated in the above step P8 are stamped out, by the outline stamping machine 90, into a shape corresponding to each unit of the wiring pattern part 21 interposed between the first and second insulating tapes 3, 5 thereby obtaining a flat wiring body as a final product.

(Operations and Effects of the Manufacturing Method of the First Embodiment)

In the manufacturing method using the above steps P1 to P9, the conductor foil 2 is divided into the wiring pattern part 21, the first conductor remainder part 22 and the second conductor remainder part 23, through the stamping step P2. That is, the conductor remainder region other than the wiring pattern part 21 is divided into the first and second conductor remainder parts 22, 23. Then, out of two, the first conductor remainder part 22 surrounding the wiring pattern part 21 is removed prior to the step P5 in which the wiring pattern part 21 is adhered to the first insulating tape 3. On the other hand, the second conductor remainder part 23 is removed after the step P5.

Accordingly, the conductor remainder part between the adjacent conductors 25 of the wiring pattern part 21 is removed before the wiring pattern part adhering step P5. As a result, ever when the corresponding region of the hot-melt layer 3a to the wiring pattern part 21 is heated with compression in the wiring pattern part adhering step P5, only necessary parts such as a wiring pattern part 21 can be securely adhered to the first insulating tape 3 while the second conductor remainder part 23 is not adhered to the same. Further, the second conductor remainder part 23 can be securely held in a non-adhesion state in the wiring pattern part adhering step P5, and the second conductor remainder part 23 is merely placed on the first insulating tape 3 before the wiring pattern part removing step P7. Accordingly, the second conductor remainder part 23 can be readily and securely removed in the step P7. Furthermore, in the preceding carrier tape peeling step P6, the carrier tape 1 is peeled so as to be separated at a steep angle so that the second conductor remainder part 23 is placed on the first insulating tape 3 with held in its flat state. Since at this state the second conductor remainder part removing step P7 is performed while the first insulating tape 3 is curved, the second conductor remainder parts 23 are recovered to the covering container 73 with held in its flat state, so that they can be collected compactly without being bulky. In addition, since at this stage the wiring pattern part 21 is securely adhered to the first insulating tape 3, it can be securely prevented that a pattern disturbance such as a displacement of the wiring pattern occurs when the second conductor remainder part 23 is removed.

On the other hand, since the first conductor remainder part 22 to be stamped out in the stamping step P2 is formed into a region defined by the cut line slightly peripherally extended from a line circumscribing the entire wiring pattern part 21, there can be satisfied the requirement of eliminating an extra conductor remainder part within the region formed substantially along the outline of the entire wiring pattern part 21 in the wiring pattern part adhering step P5 and at the same time the area of the first conductor remainder part 22 to be peeled in the first conductor remainder part removing step P3 can be minimized. Thereby, the resistance of the sticking layer 1a of the carrier tape 1 against the peeling of the first conductor remainder part 22 can be substantially reduced as compared with the conventional case where the entire conductor remainder part is peeled at a time, so that the first conductor remainder part 22 can be readily peeled with an extremely smaller tension as compared with the conventional case. Further, the temperature to heat the sticking layer 1a can be reduced in accordance with the above minimized area for peeling, so that the possibility of troubles such as a peeling of the wiring pattern part 21 can be eliminated.

<Second Embodiment>

Figure 12:
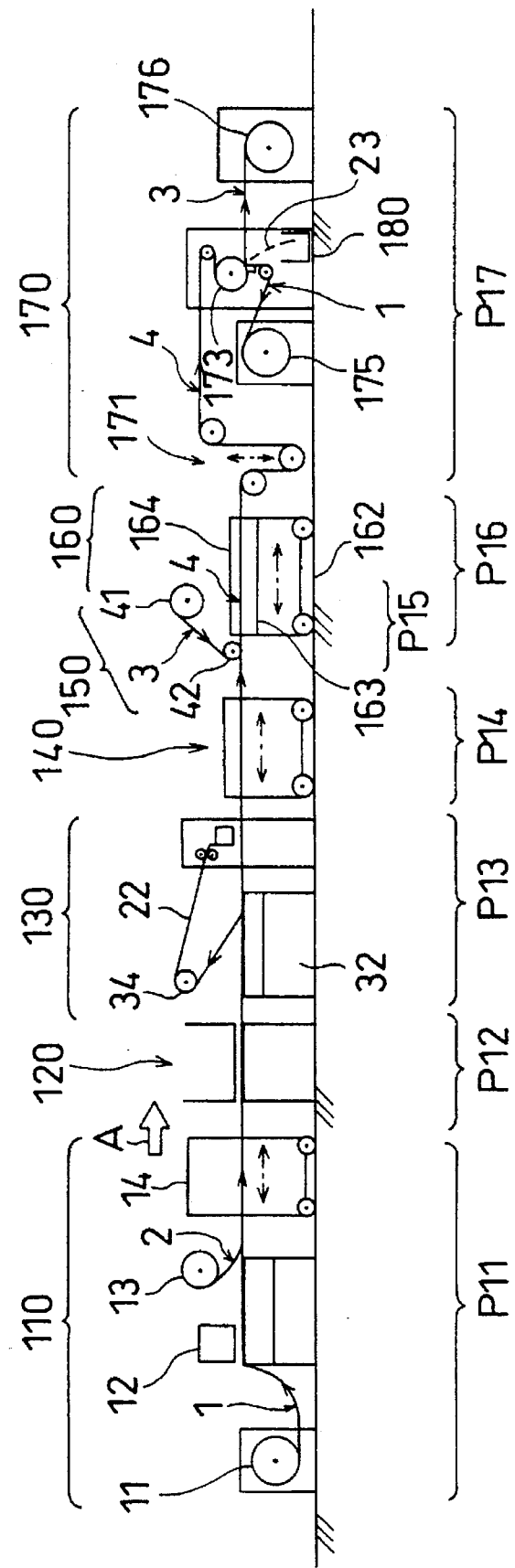
FIG. 12 is a schematic diagram of a manufacturing device for realization of a second embodiment.

FIG. 12 shows a manufacturing device for realization of a method of manufacturing a flat wiring body according to a second embodiment of the present invention. Reference numeral 110 indicates a conductor foil laminating means for performing a conductor foil laminating step P11, 120 indicates a half-cut press machine for performing a stamping step P12, 130 indicates a first conductor remainder part removing means for performing a first conductor remainder part removing step P13, 140 indicates a masking means for performing a masking step P14, 150 indicates a first insulating tape laminating means for performing a first insulating tape laminating step P15, 160 indicates a wiring pattern part adhering means for performing a wiring pattern part adhering step P16, and 170 is a separating means for performing a separating step P17 composed of a peeling of the carrier tape and a removal of the second conductor remainder part. Further, as shown in FIG. 1, a second insulating tape laminating step P8 is conducted, by the second insulating tape laminating means 80, to the first insulating tape 3 which is rolled up by a drum 176 of the separating means 170 and to which the wiring pattern part 21 is adhered, and an outline stamping step P9 is performed by the outline stamping machine 90. The wiring pattern part adhering step P16 and the separating step P17 form a transferring step according to claims 1, 5 and 7 of the present invention. Below, in each of the steps P11 to P17, description is made about the structures of means 110 to 170 to be used in the steps and the contents of the steps P11 to P17 to be performed with the use of the above means. The following description is made provided that the wiring pattern part 21 and others (see FIG. 4) having the same forms as in the first embodiment are formed.

In the second embodiment, the steps P11, P12, P13 and P15 are respectively performed in the same manner as the steps P1, P2, P3 and P4, the masking step P14 is added before the wiring pattern part adhering step P16, the step P16 is performed under vacuum suction, and a peeling of the carrier tape and a removal of the second conductor remainder part are performed simultaneously in the separating step P17. Therefore, the steps P11, P12, P13 and P15 will be briefly described, reference is made to the drawing where like reference numerals refer to like parts and detailed description is omitted.

(Conductor Foil Laminating Step P11)

The conductor foil laminating means 110 has a drum 11 around which a carrier tape 1 is wound, a sticking layer forming machine 12, a drum 13 around which a conductor foil 2 is wound, and a set-dimension feeding device 14. In the conductor foil laminating step P11, the carrier tape 1 is first fed intermittently in a direction of arrow A from the drum 11, in every unit dimension by the operation of the set-dimension feeding device 14. The carrier tape 1 thus fed is coated with sticking agent by the sticking layer forming machine 12 so that a sticking layer 1a is formed on the upper surface of the carrier tape 1 as shown in FIG. 2. Next, the conductor foil 2 is fed to the sticking layer 1a of the carrier tape 1 from the drum 13 and is then laminated on the sticking layer 1a as shown in FIG. 3 so as to be stuck to the sticking layer 1a.

(Stamping Step P12)

Figure 4:
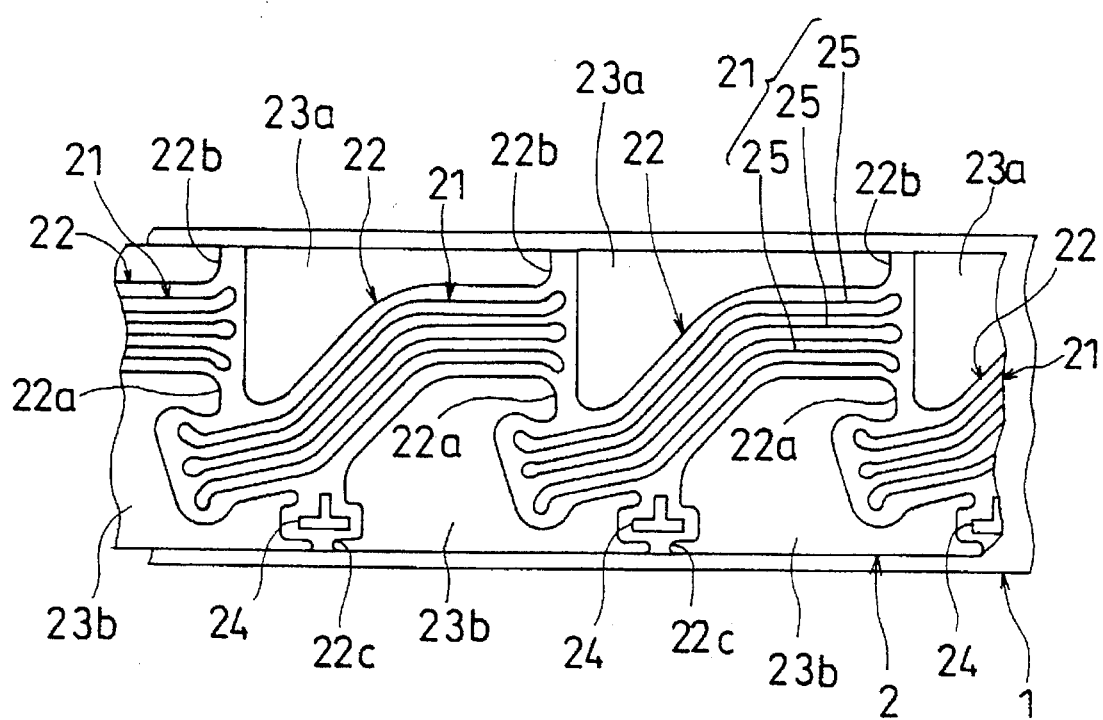
FIG. 4 is a plan view showing a state of the conductor foil on which cut lines are formed in a stamping step.

The half-cut press machine 120 has a stamping die edge (not shown) such as a Victoria die edge having a set shape. In the stamping step P12, every time the carrier tape 1 on which the conductor foil 2 is laminated is transported intermittently, the stamping die edge is moved downward by a set distance and only the conductor foil 2 which is laminated on the carrier tape 1 is stamped out, so that cut lines are formed on the conductor foil 2 without cutting the carrier tape 1. As shown in FIG. 4, the cut lines divides the conductor foil 2 into a wiring pattern part 21, a first conductor remainder part 22, two second conductor remainder parts 23a, 23b, and a positioning mark part 24.

(First Conductor Remainder Part Removing Step P13)

As shown in FIG. 5, the first conductor remainder part removing means 130 has the same structure as the first conductor remainder part removing means 30 of the first embodiment, that is, comprises a vacuum suction plate 31 for suctioning the carrier tape 1 to hold it in a flat state, a heater 32 for heating the carrier tape 1, a pair of clamp mechanisms 33, 33 for positioning the carrier tape 1 transported intermittently, a bar-shaped pulley 34, and a pair of driving pulleys 35, 35 for applying a set tension to the first conductor remainder part 22 in a peeling direction. In the first conductor remainder part removing step P13, the conductor-foil laminated carrier tape 1 which has been transported intermittently in a transporting direction A is positioned by means of both the clamp mechanisms 33, 33. Next, the carrier tape 1 is held in a flat state by operating the vacuum suction plate 31 and at this state the sticking layer 1a (see FIG. 3) is heated by the heater 32 to reduce its sticking strength. At this state, as shown in FIG. 6, a pair of driving pulleys 35 are activated to delaminate a series of first conductor remainder parts 22, 22, . . . from the carrier tape 1. According to the peeling, the first conductor remainder part 22 moves to activate a detecting sensor 36 (see FIG. 5), thereby completing the present step P13. As shown in FIG. 7, the carrier tape 1 on which the wiring pattern parts 21, 21, . . . the second conductor remainder parts 23a, 23b, . . . and the positioning marks 24, 24, . . . remain is transported to the next step P14 with these parts separated away from one another by the width corresponding to the first conductor remainder parts 22, 22, . . . thus peeled.

(Masking Step P14)

The masking means 140 comprises a masking tape holder (not shown) in which a large number of masking tapes each having a set length are accommodated, and a transporting mechanism (not shown) for transporting the masking tape holder to the connecting positions of the wiring pattern part 21 on the carrier tape 1 to attach the masking tapes one by one on the connecting positions. In the masking step P14, the masking tapes are attached to the connecting positions of the wiring pattern part 21. The attached masking tapes are stripped for simplifying connecting works by the brazing with other wiring parts when the flat wiring body as a production is assembled. The masking means 140 responds to the set-dimension feeding of the carrier tape 1 or the laminated tape 4 together with the below-mentioned transferring means 160 and is reciprocatable by a set-dimension feeding length along the carrier tape 1 or the laminated tape 4.

(First Insulating Tape Laminating Step P15)

Figure 13:
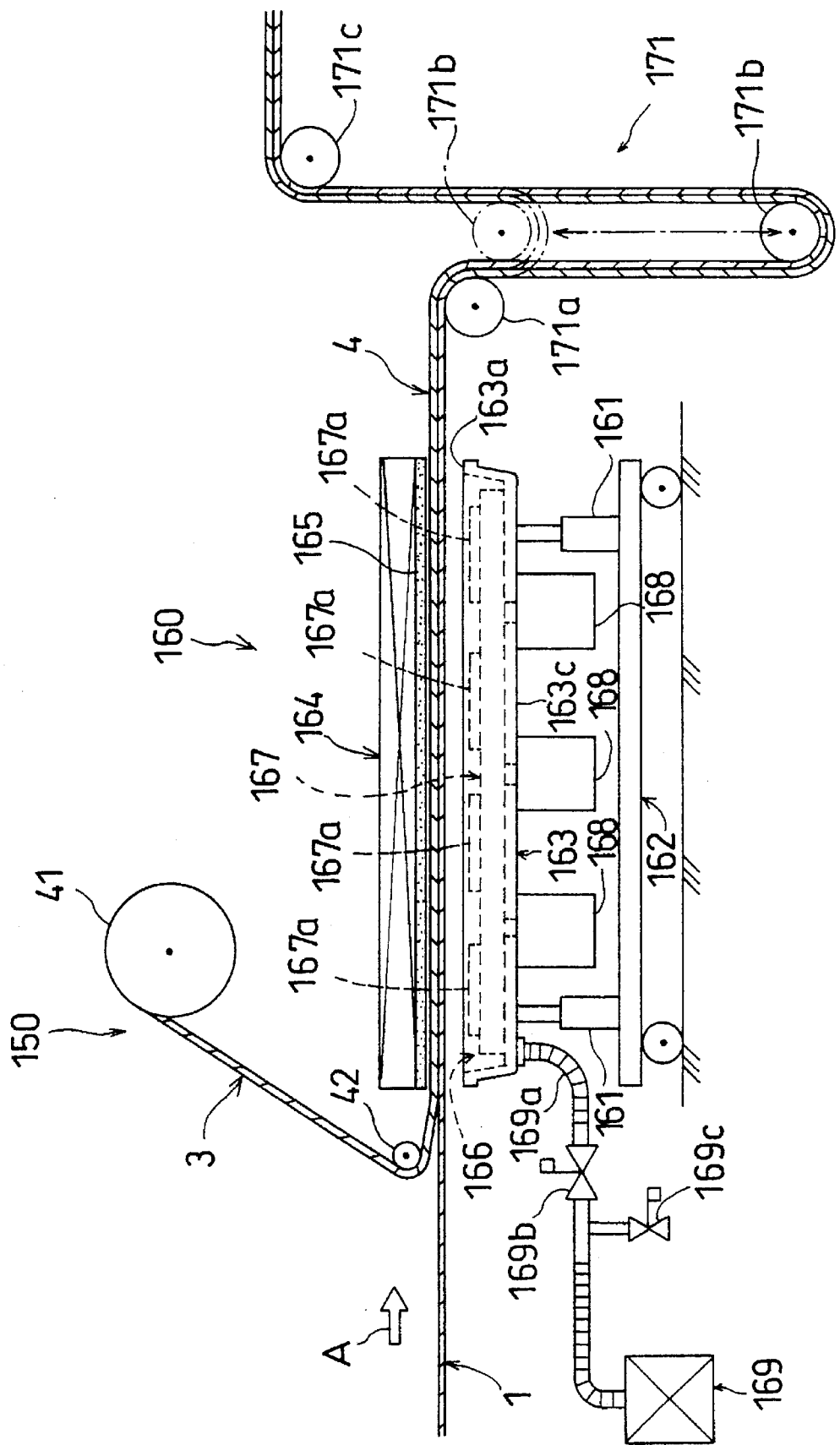
FIG. 13 is an enlarged cross-section schematically showing states of both steps of laminating the first insulating tape and adhering the wiring pattern part.

As also shown in FIG. 13, the first insulating tape laminating means 150 is composed of a drum 41 around which a first insulating tape 3 and a guide roller 42. The drum 41 and the guide roller 42 are supported on a support 162 of a wiring pattern part adhering means 160 below-mentioned so as to be integrally moved in accordance with a movement of the support 162 along the carrier tape 1. In the first insulating tape laminating step. P15, the first insulating tape 3 is fed from the drum 41, and the first insulating tape 3 and the carrier tape 1 transported from the masking means 140 are laminated. At this time, the wiring pattern parts 21, 21, . . . and the second conductor remainder parts 23a, 23b, . . . are laminated in such a manner as to be sandwiched between a hot-melt layer 3a (see FIG. 9) formed on one surface of the insulating tape 3 and the sticking layer 1a of the carrier tape 1, thereby forming a laminated tape 4 as a laminate.

(Wiring Pattern Part Adhering Step P16)

Figure 14:
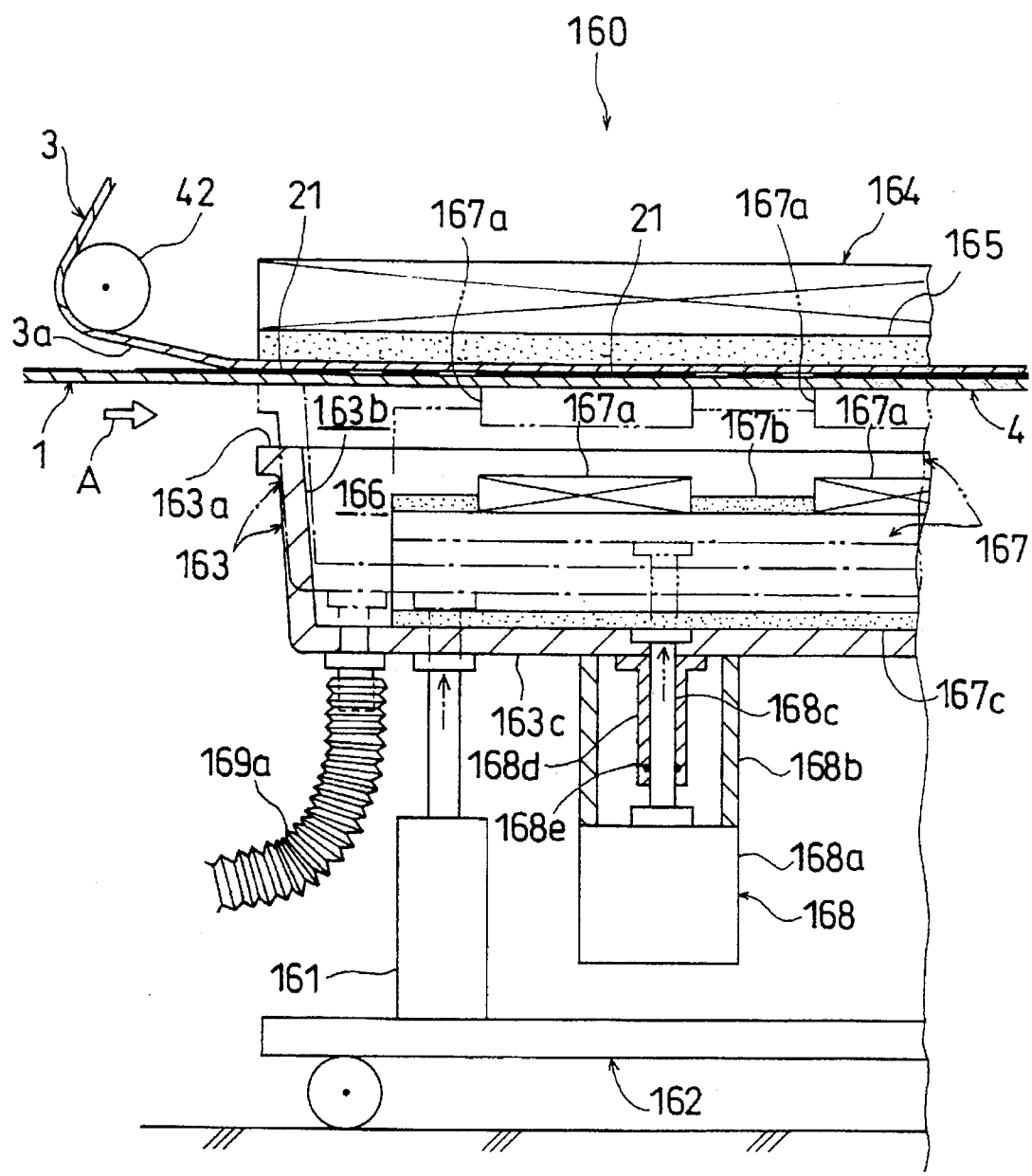
FIG. 14 is a partly enlarged cross-section of a wiring pattern part adhering means of FIG. 13.

As shown in FIGS. 13 and 14, the wiring pattern part adhering means 160 comprises a lower table 163 supported movably upward and downward with respect to the support 162 by first vertical cylinders 161, 161, and an upper table 164 supported to the support 162 so as to be vertically opposed to the lower table 163 via the laminated tape 4. The lower table 163 is formed into a flat box opened upward. The upper table 164 has a bottom surface equal in area to an opening edge 163a of the lower table 163 or larger and the entire bottom surface is covered with an elastic sheet 165 for sealing a chamber 166 below-mentioned. When the lower table 163 comes into close contact with the elastic sheet 165 of the upper table 164 by upward movements of the first air cylinders 161 with the laminated tape 4 sandwiched therebetween, the chamber 166 which is an enclosed space is formed by the inner surface 163b of the lower table 163 and the elastic sheet 165.

Inside the lower table 163, there are disposed a hot plate 167 and one or plural (four in the figure) heat conducting plates 167a, 167a, . . . as heating plates contacting the top surface of the hot plate 167. The top and bottom surfaces of the heat plate 167 are covered with heat insulating plates 167b, 167c (see FIG. 14), thereby blocking vertical thermal effects. Specified positions of the upper heat insulating plates 167b are cut away and respective heat conducting plates 167a are engaged therein, thereby positioning the heat conducting plates 167a.

Preferably, the upper heat insulating plate 167b is formed of a two-layer structure in which a silicon rubber foam sheet or the like having a good thermal insulating property is affixed on a metal plate or the like. The heat conducting plates 167a are each made of material having a good thermal conductivity, are each composed of a piece having the form substantially matched with the entire wiring pattern part 21 (see FIG. 7) and a piece having the form matched with the positioning mark part 24, and are positioned at intervals at which the wiring pattern parts 21 are disposed. Thus, in the present embodiment shown in the figure, the wiring pattern part adhering step P16 is conducted to four units of wiring pattern parts 21, 21, . . . by means of four heat conducting plates 167a, 167a, . . . at a time and the laminated tape 4 is transported intermittently at every length corresponding to four units of wiring pattern parts 21, 21, . . . . The positioning between each of the heat conducting plates 167a and the corresponding wiring pattern part 21 is conducted in such a manner as to detect a predetermined positioning mark 24 through an optical sensor (not shown) to stop the movement of the laminated tape 4.

In addition, the lower table 163 is provided at the bottom with second vertical cylinders 168, 168, . . . for moving upward and downward the hot plate 167 together with the heat conducting plates 167a. An upper end of a piston rod 168a of the second vertical cylinder 168 penetrates the bottom 163c of the lower table 163 and is then connected to the lower heat insulating plate 167c of the heat plate 167. By vertical movements of rods of the second vertical cylinders 168, the heat conducting plates 187a are shifted alternately to one of a sunk position at which the heat conducting plates 167a are sunk in the lower table 163 as shown in a solid line in FIG. 14 and a pressing position which is below the wiring pattern part 21 as shown in a two-dots-dash line in FIG. 14 and at which the heat conducting plates 167a press the lower surface of the carrier tape 1. The cylinder body 168a of each of the second cylinders 168 is fixed to the bottom surface of the bottom wall 163c of the lower table 163 via an outer cylinder 168b and the outer cylinder 168b covers the surroundings of the piston rod 168c to cut off it from the outside. The piston rod 168c is inserted in an inner cylinder 188d. The inner cylinder 168d is fixed at an upper end thereof to the bottom wall 163c and a seal ring 168e is engaged between the inner periphery of a lower end of the inner cylinder 168d and the outer periphery of the piston rod 168c, thereby preventing an outside air from entering the chamber 168 through the periphery of the piston rod 168c.

The lower table 163 is connected to a vacuum pump 189 via a pipeline 169a and the pipeline 169a is provided with a shut-off valve 169b and a leak valve 169c. At the time of formation of the chamber 166, the chamber 166 is suctioned by the operation of the vacuum pump 169 thereby producing a set vacuum state.

The wiring pattern part adhering step P16 is initiated, after the laminated tape 4 is transported in a transporting direction A, when the laminated tape 4 is stopped at a predetermined position. First, the lower table 163 is moved upward from the lower position (the position shown in a solid line in FIGS. 13 and 14) by the action of the first vertical cylinders 161 to sandwich the laminated tape 4 between the opening edge 163a of the lower table 163 and the elastic sheet 165 and press it. Then, the formed chamber 166 is made in a set vacuum state by the operation of the vacuum pump 169. At this vacuum state, the second vertical cylinders 168 are operated so that the heat conducting plates 187a are shifted upward from the sunk position to the pressing position. According to this, a set temperature of heat from the hot plate 167 is acted on a set region of the laminated tape 4 through the heat conducting plates 167a. Thereby, out of the hot-melt layer 3a of the first insulating tape 3 of the laminated tape 4, only the region covering the wiring pattern parts 21 and the positioning marks 24 is heated with compression so that only the wiring pattern parts 21 and the positioning marks 24 are adhered to the first insulating tape 3. At this time, the heat insulating plates 167a blocks thermal effects on the region other than the wiring pattern parts 21 and the positioning marks 24, that is, on the second conductor remainder part 23. Accordingly, the hot-melt layer 3a at the region covering the second conductor remainder parts 23 can be prevented from melting so as to be held in a non-adhesion state with the first insulating tape 3. After a set time passes, the second vertical cylinders 168 are operated so that the heat conducting plates 167a are moved downward to the sunk position. Then, the leak valve 189c is opened so that the inner space of the chamber 166 is made in an atmospheric pressure, and thereafter the first vertical cylinders 161 are operated so that the lower table 163 is returned to the lower position. Next, the laminated tape 4 is relatively moved by one unit region and the wiring pattern part adhering step P18 is repeated.

(Separating Step P17)

Figure 15:
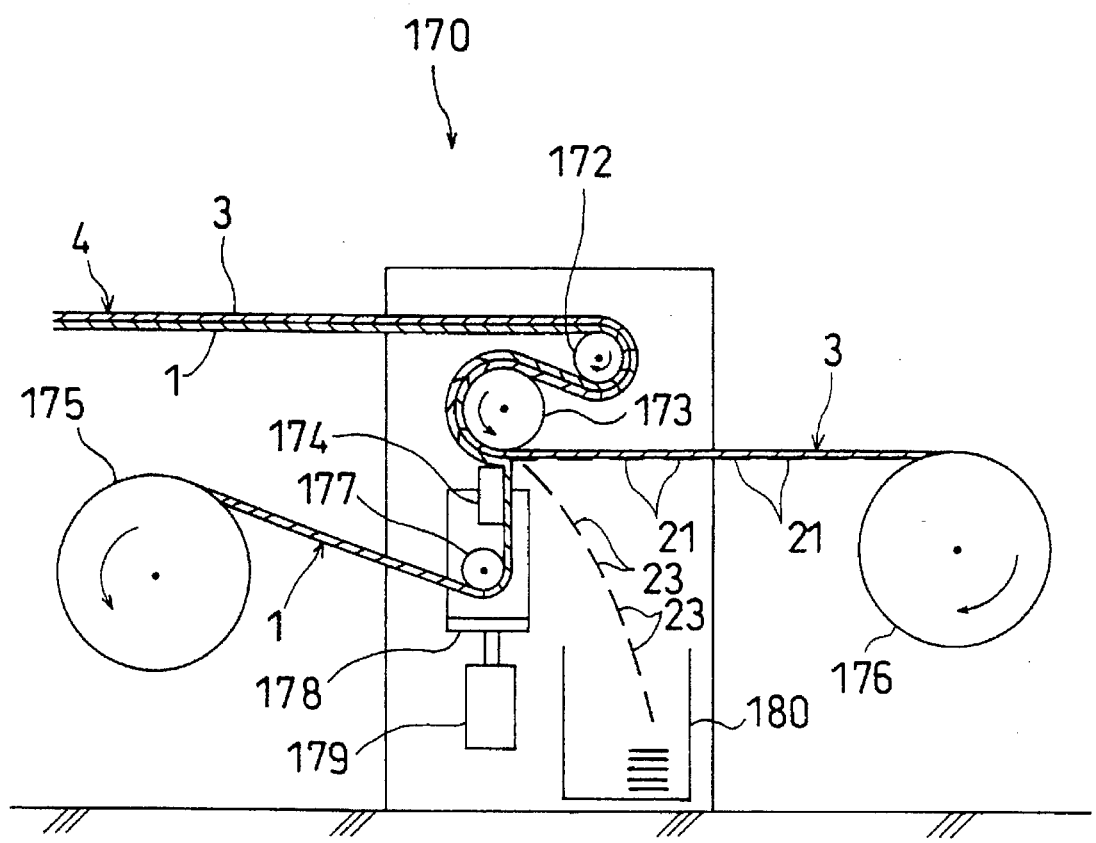
FIG. 15 is an enlarged cross-section showing a state of a laminated-tape separating step.
Figure 16:
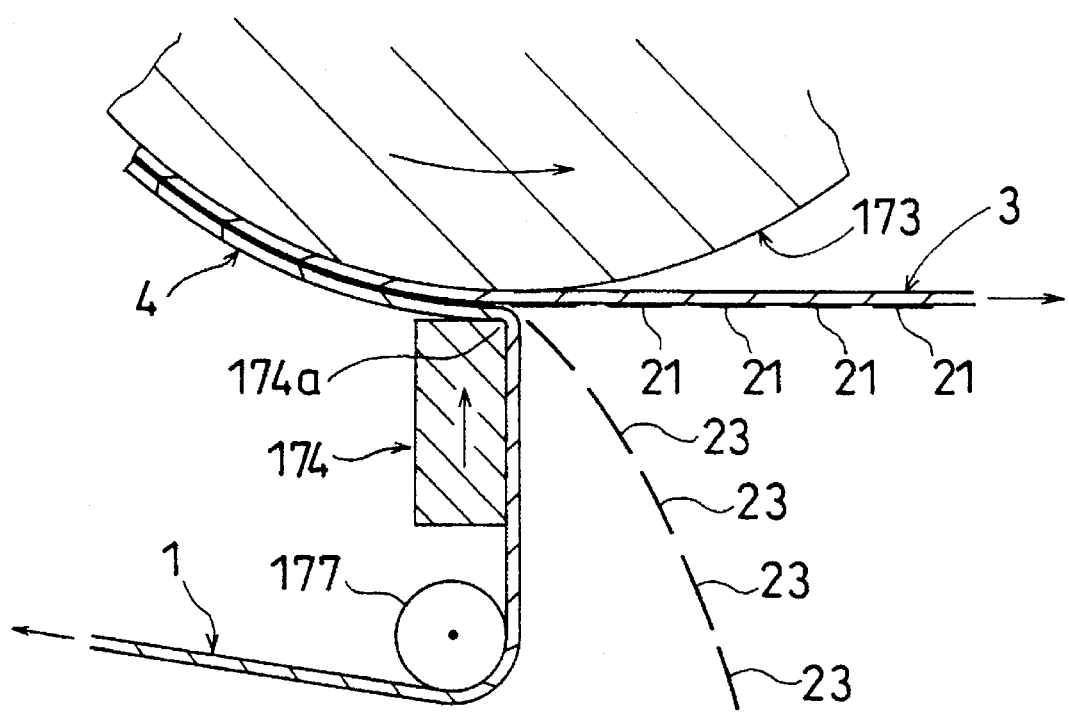
FIG. 16 is a partly enlarged cross-section of a roller heater and a delaminating bar of FIG. 15.
Figure 17:
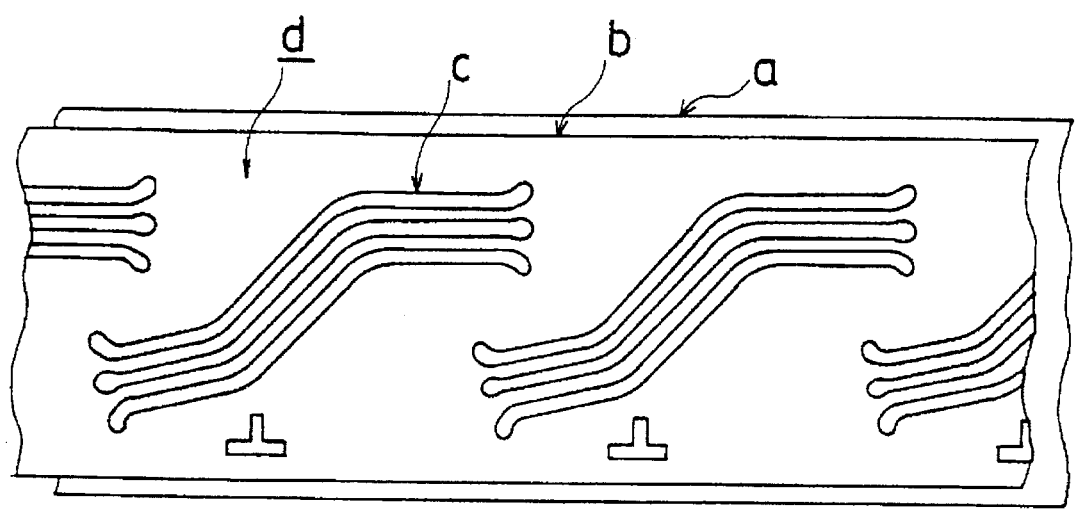
FIG. 17 is a plan view of a state that cut lines are formed on a conductor foil by the conventional stamping step.

The separating means 170 has an accumulator 171 (see FIG. 13) as a continuous transporting mechanism for shifting the intermittent movement of the laminated tape 4 by a unit-dimension transport to the wiring pattern part adhering step P16 by the wiring pattern part adhering means 160 to a continuous movement, a guide roller 172 shown in FIG. 15, a roller heater 173, a delaminating bar 174, a recovering drum 175 for continuously recovering the peeled carrier tape 1, and a drum 176 for rolling up the first insulating tape 3 to which the wiring pattern parts 21, 21, . . . are adhered.

The accumulator 171 has a first guide roller 171a for curving and guiding downward the laminated tape 4 transported from the wiring pattern part adhering means 160, an adjusting roller 171b for orienting upward the laminated tape 4 after extending it downward by a specified distance, a second guide roller 171c for curving and guiding the upward-oriented laminated tape 4 in a horizontal direction again, and a driving means (not shown) for reciprocating the adjusting roller 171b in a vertical direction. When the driving means is activated in synchronization with the intermittent movement according to the unit-dimension transport of the laminated tape 4, the adjusting roller 171b are reciprocated in a vertical direction so that the laminated tape 4 at the downstream side from the second guide roller 171c is continuously transported. That is, during the stop of the laminated tape 4 at the upstream side from the first guide roller 171a, the adjusting roller 171b is moved upward at a specified speed from the lower position (shown in a solid line in FIG. 13) to the upper position (shown in a dot-dash line in FIG. 13), so that the laminated tape 4 at the downstream side from the second guide roller 171c is continuously transported. On the other hand during the movement of the laminated tape 4 at the upstream side from the first guide roller 171a, the adjusting roller 171b is moved downward at a specified speed from the upper position to the lower position, so that the laminated tape 4 at the downstream side from the second guide roller 171c is continuously transported and a margin for the next time stop of the laminated tape 4 is formed.

Further, the roller heater 173 is heated at the outer periphery to a set temperature (for example, approximately 100° C.) and is rotated by a motor not shown. The laminated tape 4 is rolled around the outer periphery of the roller heater 173 so that the sticking layer 1a of the carrier tape 1 of the laminated tape 4 is heated by the roller heater 173 thereby reducing the sticking strength. The heating temperature is set to a maximum capable of reducing the sticking strength of the sticking layer 1a of the carrier tape 1 within the range that the adhesive layer 3a of the first insulating tape 3 is not melt.

The delaminating bar 174 and the guide roller 177 disposed below the delaminating bar 174 are supported on a supporting frame member 178. The supporting frame member 178 is connected to a cylinder 179 and moves upward and downward the delaminating bar 174 by the action of the cylinder 179. The delaminating bar 174 applies a slight pressing force to the laminated tape 4 contacting the lower end of the periphery of the roller heater 173 by a set distance rise of the rod of the cylinder 179 and is simultaneously held in a position where it maintains a set vertical distance from the roller heater 173. As shown in detail in FIG. 18, the cross section of the delaminating bar 174 is formed in such a manner that a corner 174a at the front of the upper end of the delaminating bar 174 has an arc having a slight curvature. The delaminating bar 174 bends the carrier tape 1 at a steep angle along the corner 174a to separate it away from the laminated tape 4.

In the separating step P17, the laminated tape 4 continuously transported is heated by the roller heater 173 so that the sticking layer 1a of the carrier tape 1 forming the laminated tape 4 is decreased in sticking strength. Then, the carrier tape 1 is curved at a steep angle at the corner 174a of the delaminating bar 174 so that it is peeled from the wiring pattern parts 21 and the second conductor remainder parts 23. As a result, while the first insulating tape 3 to which the wiring pattern parts 21, 21, . . . are adhered is recovered to the drum 178, the second conductor remainder parts 23, 23, ... which are not adherent to the first insulating tape 3 are recovered in a recovering container 180 in such a manner as to be dropped thereinto. Thus, there can be realized the individual recoveries of the carrier tape 1 and the first insulating tape 3 with the wiring pattern part 21 by separating the laminated tape 4, and at the same time there can be realized the removal and recovery of the second conductor remainder parts 23, 23, ... from the laminated tape 4.

(Operations and Effects of the Manufacturing Method of the Second Embodiment)

In the manufacturing method according to the above steps P11 to P17, the same effects as in the first embodiment can be obtained. Further, effects by performing the wiring pattern part adhering step P18 under a reduced pressure can be also obtained. In detail, since the laminated tape 4 is placed in the chamber 166 formed in a specified vacuum state and at this state it is heated with compression in such a manner that a certain part of each wiring pattern part 21 is sandwiched between each heat conducting plate 167a and the elastic sheet 165 of the upper table 164, it can be securely prevented that foam enters an interface between the wiring pattern part 21 to be adhered and the adhesive layer 3a of the first insulating tape 3 to which the wiring pattern part 21 is adhered. Accordingly, the entire wiring pattern part 21 can be securely affixed to the first insulating tape 3.

Further, in the separating step P17, since the carrier tape 1 is peeled with the use of the roller heater 173 and the delaminating bar 174, the second conductor remainder parts 23, 23, ... can be simultaneously removed and recovered.

<Other Embodiments>

The present invention can include various embodiments other than the first and second embodiments. In the above embodiments, the wiring pattern part 21 composed of three conductors 25, 25, ... is illustrated. However, the wiring pattern part may be composed of a single straight or curved conductor, or composed of multiple conductors. In these cases, the shape of the heat conducting plate in the wiring pattern part adhering step P5 or P16 is changed in accordance with the shape of the wiring pattern part.

Each of the above embodiments illustrates the first conductor remainder part 22 including the part surrounding the positioning mark 24. In the present invention, the first conductor remainder part 22 is not limited to the above. For example, in the case that the positioning mark is formed of a punching hole, the part surrounding the positioning mark is not necessary as a part of the first conductor remainder part.

In the above embodiments, the first conductor remainder part 22 includes the extending parts 22b, 22c and the second conductor remainder part 23 is divided into two parts 23a, 23b in every unit of the wiring pattern part 21. The extending parts 23b, 23c may be eliminated. In this case, the removal of the second conductor remainder parts in the step P7 or the step P17 can be made with the use of a drum for rolling up or the like.

Further, in the above embodiments, the first conductor remainder part 22 is set to the outer region having a shape that is slightly peripherally extended from the wiring pattern part 21. However, it is essential only that at least an unnecessary part of the conductor foil within a region surrounding the entire wiring pattern part 21 can be removed to obtain the effects in the wiring pattern part adhering step P5 or P16. For example, the first conductor remainder part may have a shape including a region larger than the region of the above embodiments. Also in this case, peeling in the first conductor remainder part removing step P3 or P13 can be readily made with a smaller tension as compared with the conventional case of removing the entire conductor remainder part.

In the wiring pattern part adhering step P5 of the first embodiment, heat is applied, by the lower hot plate 53, to the first insulating tape 3 side of the laminated tape 4 in which the carrier tape 1 is located at the upside and the first insulating tape 3 is located at the downside. Alternatively, a specified region on the carrier tape 1 side may be heated so that the wiring pattern part 21 is adhered to the corresponding region of the hot-melt layer 3a. In this case, the laminated tape 4 is arranged upside down, that is, in such a manner that the carrier tape 1 is located at the downside of the laminated tape 4 with respect to the equipment of FIG. 8.

Further, in the carrier tape peeling step P6 after the wiring pattern part adhering step P5 of the first embodiment, only the carrier tape 1 is peeled while the second conductor remainder part 23 is left placed on the first insulating tape 3 at a non-adhesion state to it. Alternatively, in the carrier tape peeling step the carrier tape may be peeled from the laminate with the second conductor remainder part stuck to the carrier tape, and then in another step the second conductor remainder part may be removed from the carrier tape. In this case, the peeling of the carrier tape to which the second conductor remainder part is stuck, is achieved by separating the carrier tape from the laminate at a mild angle. In the subsequent step of removing the second conductor remainder part, there is adopted a method of curving the carrier tape at a steep angle with the delaminating bar pressed against the outer surface of the carrier tape to remove from the carrier tape the second conductor remainder part which is stuck to the carrier tape.

According to the adoption of such a method, the removal of the second conductor remainder part is performed in the step different from the carrier tape peeling step, thereby further securely removing the second conductor remainder part. That is, if any trouble generates at the removal of the second conductor remainder part, the trouble can be treated with no effects on the step prior to the second conductor remainder part removing step because the removal of the second conductor remainder part is made in the step different from the carrier tape peeling step. Meanwhile, it may occur as one of such kinds of troubles that the sticking strength of the carrier tape is too large to delaminate the second conductor remainder part from the carrier tape. In the above method, however, since the removal of the second conductor remainder part is carried out in a different step, the procedures in which the carrier tape is individually heated to reduce the sticking strength and thereafter the second conductor remainder part is removed are possible. Accordingly, the possibility of generation of the above trouble can be eliminated, thereby permitting the second conductor remainder part to be securely removed. That is, in the case where the peeling of the carrier tape and the removal of the second conductor remainder part are simultaneously performed, to adopt the method of reducing the sticking strength of the carrier tape by the above heating operation, the heating operation must be made with respect to the laminate. The heating operation under such conditions may cause melting of the adhesive layer of the insulating tape. On the other hand, if the removal of the second conductor remainder part is made, in a different step, in such a manner as to delaminate it from the carrier tape, it can be readily realized to apply heat only to the sticking layer of the carrier tape.

We claim:

1. A method of manufacturing a flat wiring body, comprising the steps of:

laminating a conductor foil on one surface of a carrier tape through a sticking layer;

stamping out, without cutting the carrier tape, the laminated conductor foil along cut lines which divide the conductor foil into a wiring pattern part and a conductor remainder part other than the wiring pattern part;

stamping out, without cutting the carrier tape, the conductor foil along cut lines which divide the conductor remainder part into a first conductor remainder part continuously enclosing the entirety of the wiring part and a second conductor remainder part excluding the first conductor remainder part;

removing the first conductor remainder part out of the conductor foil by peeling the first conductor remainder part from the carrier tape, leaving the second conductor remainder part on the carrier tape, after the step of stamping out the conductor foil along the cut lines which divide the conductor remainder part into the first and second conductor remainder parts;

forming a laminate by laminating an insulating tape having an adhesive layer on the carrier tape from which the first conductor remainder part is removed so that the adhesive layer is in contact with the wiring pattern part; and transferring the wiring pattern part of the laminate to the insulating tape, wherein in the step of transferring the wiring pattern part, only the wiring pattern part is adhered to the insulating tape by applying heat and pressure to only a region corresponding to the wiring pattern part in the laminate.

2. A method of manufacturing a flat wiring body according to claim 1 wherein, in the step of stamping out the conductor foil along the cut lines which divide the conductor remainder part into the first and second conductor remainder parts, the first conductor remainder part is divided in the shape which encloses a region where the periphery of a region enclosing the entirety of the wiring pattern part is slightly extended.

3. A method of manufacturing a flat wiring body according to claim 1, wherein the step of adhering the wiring pattern part in the transferring step is performed with the use of a hot plate having a shape corresponding to the entire wiring pattern part in a manner of pressing the hot plate against a position of an outer surface of the insulating tape or a position of an outer surface of the carrier tape each corresponding to the position of the wiring pattern part.

4. A method of manufacturing a flat wiring body according to claim 1, wherein the step of adhering the wiring pattern part in the transferring step is performed in a manner that after the entire laminate including the wiring pattern part is positioned in a chamber, the chamber is reduced in pressure and the laminate is heated with compression under the reduced pressure.

5. A method of manufacturing a flat wiring body according to claim 1, wherein the transferring step includes a step of peeling the carrier tape in a manner of separating it from the laminate at a steep angle while pressing a delaminating bar against the outer surface on the carrier tape side of the laminate after the wiring pattern part adhering step of adhering only the wiring pattern part to the insulating tape.

6. A method of manufacturing a flat wiring body according to claim 5, wherein the step of peeling the carrier tape from the laminate and a second conductor remainder part removing step of removing the second conductor remainder part are sequentially carried out.

7. A method of manufacturing a flat wiring body according to claim 5, wherein the transferring step includes a separating step of simultaneously carrying out the peeling of the carrier tape from the laminate having the wiring pattern part and the removal of the second conductor remainder part.

8. A method of manufacturing a flat wiring body according to claim 7, wherein the carrier tape or the laminate is intermittently transported forward in unit dimensions and the stamping step, the first conductor remainder part removing step and the wiring pattern part adhering step are carried out when the carrier tape or the laminate are put on hold, and the separating step is carried out while the laminate is continuously transported forward through a continuous transporting mechanism after the wiring pattern part adhering step.

9. A method of manufacturing a flat wiring body according to claim 1, wherein the transferring step further includes a step of peeling the carrier tape from the laminate with the second conductor remainder part stuck to the carrier tape after the wiring pattern part adhering step and then removing the second conductor remainder part from the carrier tape in a manner of curving the carrier tape at a steep angle while pressing a delaminating bar against an outer surface of the carrier tape.

* * * * *